United States Patent
Karda et al.

(10) Patent No.: US 12,361,977 B2
(45) Date of Patent: *Jul. 15, 2025

(54) MEMORY DEVICE HAVING SHARED READ/WRITE DATA LINE FOR 2-TRANSISTOR VERTICAL MEMORY CELL

(71) Applicant: Micron Technology, Inc., Boise, ID (US)

(72) Inventors: Kamal M. Karda, Boise, ID (US); Haitao Liu, Boise, ID (US); Karthik Sarpatwari, Boise, ID (US); Durai Vishak Nirmal Ramaswamy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 571 days.

This patent is subject to a terminal disclaimer.

(21) Appl. No.: 16/725,793

(22) Filed: Dec. 23, 2019

(65) Prior Publication Data

US 2020/0211602 A1   Jul. 2, 2020

Related U.S. Application Data

(60) Provisional application No. 62/785,142, filed on Dec. 26, 2018.

(51) Int. Cl.
*G11C 5/06* (2006.01)
*G11C 11/4074* (2006.01)
(Continued)

(52) U.S. Cl.
CPC .......... *G11C 5/063* (2013.01); *G11C 11/4074* (2013.01); *G11C 11/4096* (2013.01); *H10B 12/01* (2023.02); *H10B 12/20* (2023.02)

(58) Field of Classification Search
CPC . G11C 5/063; G11C 11/4074; G11C 11/4096; G11C 11/4097; G11C 11/403;
(Continued)

(56) References Cited

U.S. PATENT DOCUMENTS 5,357,464 A * 10/1994 Shukuri ................ G11C 11/401
365/185.21
6,396,745 B1   5/2002 Hong et al.
(Continued)

FOREIGN PATENT DOCUMENTS

CN   113728433   11/2021
KR   20130109821   10/2013
(Continued)

OTHER PUBLICATIONS

Merriam-Webster OnLine Dictionary Definition of Portion. No Date.*

(Continued)

*Primary Examiner* — Nathan W Ha
(74) *Attorney, Agent, or Firm* — Schwegman Lundberg & Woessner, P.A.

(57) ABSTRACT

Some embodiments include apparatuses and methods of forming the apparatuses. One of the apparatuses includes a first data line, a second data line, a conductive line, and a memory cell coupled to the first and second data lines. The memory cell includes a first transistor and a second transistor. The first transistor includes a first region electrically coupled to the first and second data lines, and charge storage structure electrically separated from the first region. The second transistor includes a second region electrically separated from the first region, the second region electrically coupled to the charge storage structure and the second data line. The conductive line is electrically separated from the first and second channel regions. Part of the conductive line (Continued)

is spanning across part of the first region of the first transistor and part of the second region of the second transistor.

29 Claims, 34 Drawing Sheets

(51) Int. Cl.
*G11C 11/4096* (2006.01)
*H10B 12/00* (2023.01)

(58) Field of Classification Search
CPC ..... H10B 12/20; H10B 12/01; H01L 29/7889; H01L 27/10802; H01L 27/10844; H01L 29/78; H01L 27/11582
USPC ........................................... 257/302
See application file for complete search history.

(56) References Cited

U.S. PATENT DOCUMENTS

| | | | |
|---|---|---|---|
| 6,504,755 | B1 | 1/2003 | Katayama et al. |
| 8,759,895 | B2 * | 6/2014 | Tang ................ H01L 29/40114 257/314 |
| 10,892,264 | B2 * | 1/2021 | Pulugurtha ....... H01L 27/10844 |
| 11,476,252 | B2 * | 10/2022 | Sarpatwari ............. H10B 12/20 |
| 11,985,806 | B2 * | 5/2024 | Karda ................... H10B 12/01 |
| 2002/0089024 | A1 | 7/2002 | Iwata |
| 2013/0077397 | A1 | 3/2013 | Kurita et al. |
| 2013/0228839 | A1 * | 9/2013 | Arai ................... H01L 29/7869 257/300 |
| 2013/0256774 | A1 | 10/2013 | Jeon et al. |
| 2016/0260775 | A1 | 9/2016 | Takaki |
| 2017/0271338 | A1 | 9/2017 | Yamazaki et al. |
| 2018/0061834 | A1 | 3/2018 | Derner et al. |
| 2018/0269210 | A1 | 9/2018 | Tezuka et al. |

FOREIGN PATENT DOCUMENTS

| | | |
|---|---|---|
| KR | 20140106239 | 9/2014 |
| WO | 2020139847 | 7/2020 |

OTHER PUBLICATIONS

"International Application Serial No. PCT US2019 068387, International Search Report mailed Apr. 22, 2020", 5 pgs.

"International Application Serial No. PCT US2019 068387, Written Opinion mailed Apr. 22, 2020", 4 pgs.

"International Application Serial No. PCT US2019 068387, International Preliminary Report on Patentability mailed Jul. 8, 2021", 7 pgs.

"European Application Serial No. 19903057.8, Response Filed Feb. 3, 2022 to Communication Pursuant to Rules 161(2) and 162 EPC mailed Aug. 3, 2021", 10 pgs.

"European Application Serial No. 19903057.8, Partial Supplementary European Search Report mailed Aug. 23, 2022", 13 pgs.

* cited by examiner

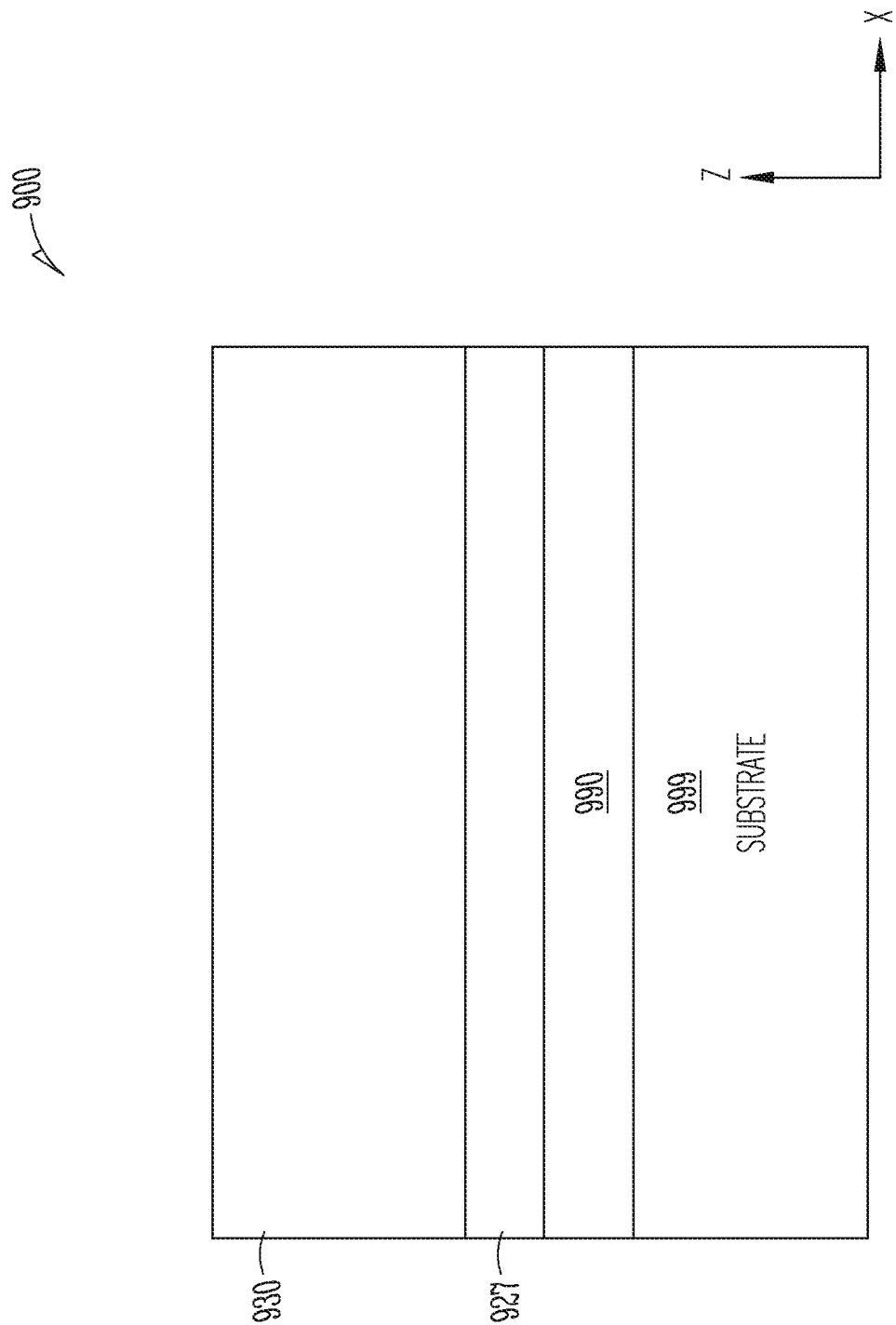

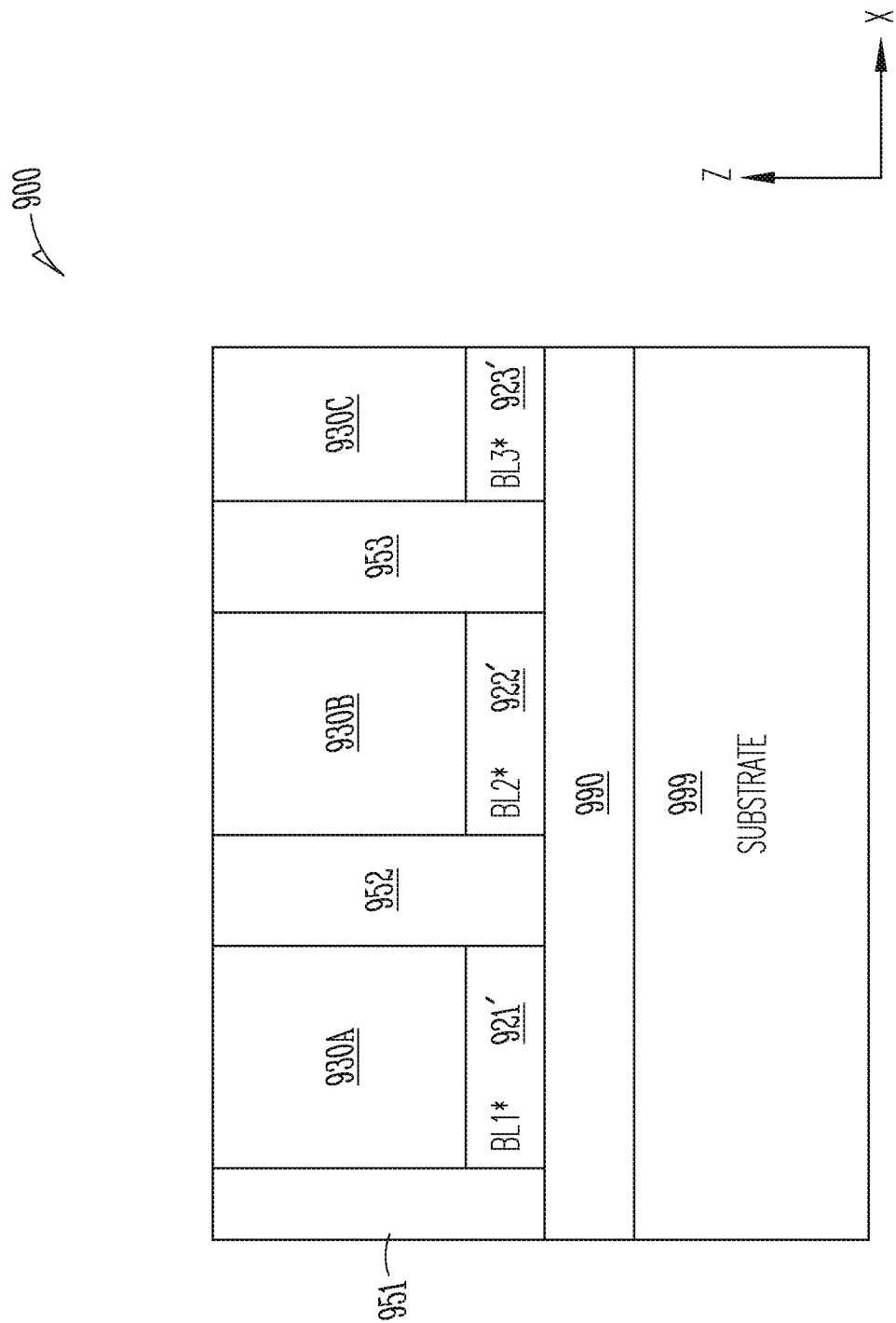

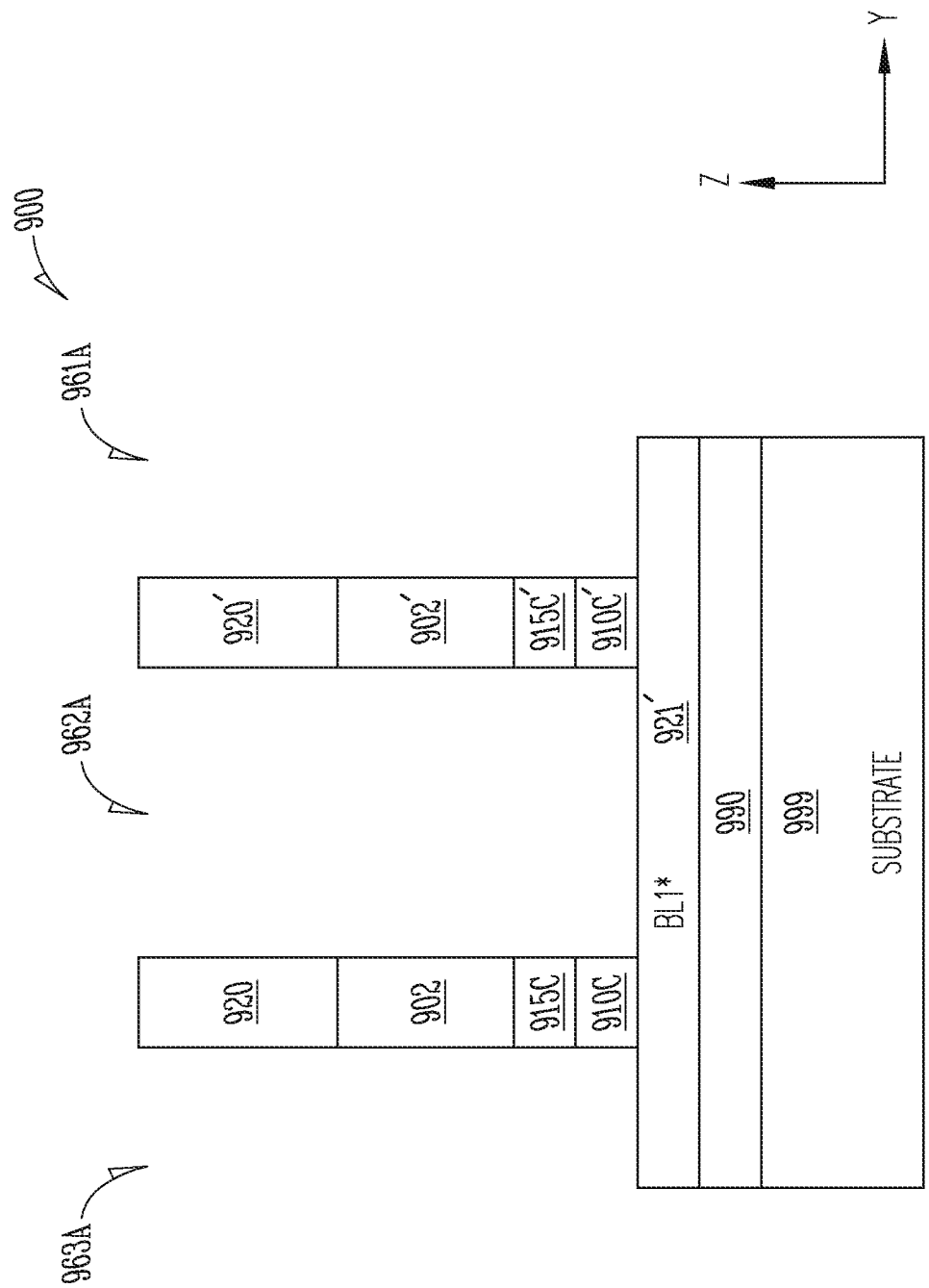

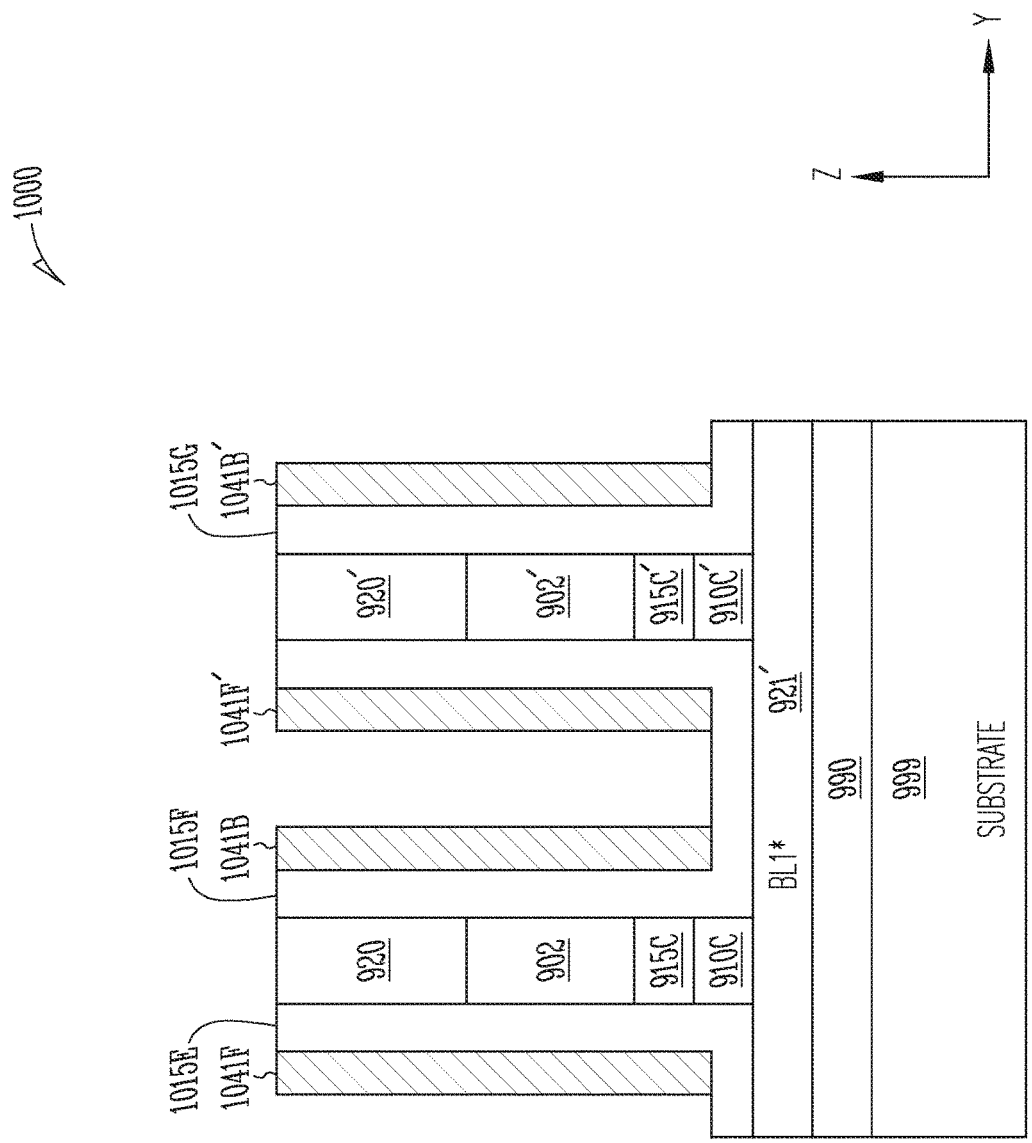

MEMORY DEVICE HAVING SHARED READ/WRITE DATA LINE FOR 2-TRANSISTOR VERTICAL MEMORY CELL

PRIORITY APPLICATION

This application claims the benefit of priority to U.S. Provisional Application Ser. No. 62/782,142, filed Dec. 26, 2018, which is incorporated herein by reference in its entirety.

BACKGROUND

Memory devices are widely used in computers and many other electronic items to store information. Memory devices are generally categorized into two types: volatile memory device and non-volatile memory device. An example of a volatile memory device includes a dynamic random-access memory (DRAM) device. An example of a non-volatile memory device includes a flash memory device (e.g., a flash memory stick). A memory device usually has numerous memory cells to store information. In a volatile memory device, information stored in the memory cells is lost if supply power is disconnected from the memory device. In a non-volatile memory device, information stored in the memory cells is retained even if supply power is disconnected from the memory device.

The description herein involves volatile memory devices. Most conventional volatile memory devices store information in the form of charge in a capacitor structure included in the memory cell. As demand for device storage density increases, many conventional techniques provide ways to shrink the size of the memory cell in order to increase device storage density for a given device area. However, physical limitations and fabrication constraints may pose a challenge to such conventional techniques if the memory cell size is to be shrunk to a certain dimension. Unlike some conventional memory devices, the memory devices described herein include features that can overcome challenges faced by conventional techniques.

BRIEF DESCRIPTION OF THE DRAWINGS

FIG. 10A through FIG. 10E show processes of forming another memory device, the processes of forming the memory device shown in FIG. 10A through FIG. 10E can be a variation of the processes of forming the memory device of 9A through FIG. 9R, according to some embodiments described herein.

DETAILED DESCRIPTION

The memory device described herein includes volatile memory cells in which each of the memory cells can include two transistors (2T). One of the two transistors has a charge storage structure, which can form a memory element of the memory cell to store information. The memory device described herein can have a structure (e.g., a 4F2 cell footprint) that allows the size of the memory device to be relatively smaller than the size of similar conventional memory devices. The described memory device can include a signal access line to control two transistors of a memory cell. This can lead to reduced power dissipation and improved processing. Other improvements and benefits of the described memory device and its variations are discussed below with reference to FIG. 1 through FIG. 10E.

Figure 1:
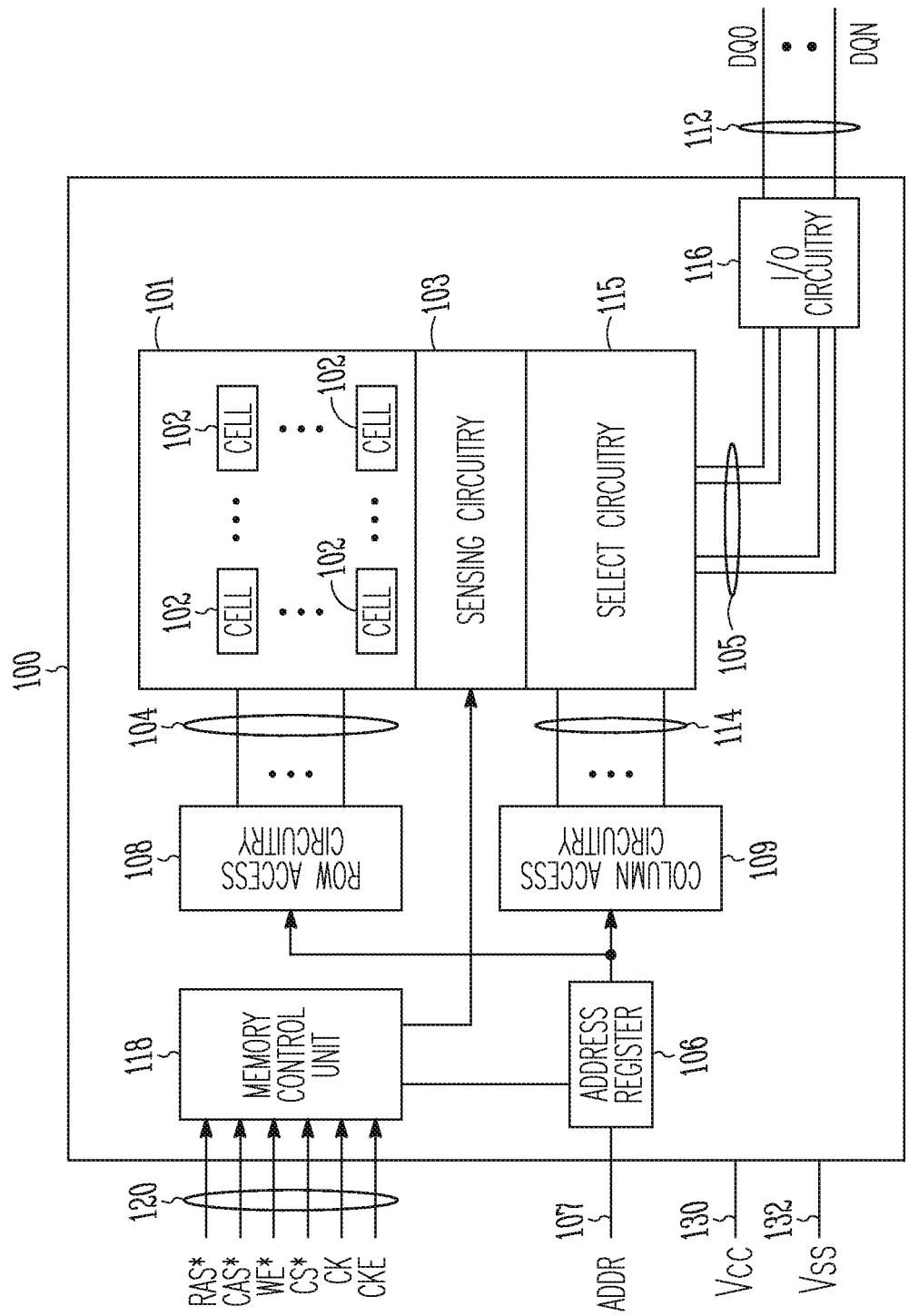
FIG. 1 shows a block diagram of an apparatus in the form of a memory device including volatile memory cells, according to some embodiments described herein.

FIG. 1 shows a block diagram of an apparatus in the form of a memory device 100 including volatile memory cells, according to some embodiments described herein. Memory device 100 includes a memory array 101, which can contain memory cells 102. Memory device 100 is volatile memory device (e.g., a DRAM device), such that memory cells 102 are volatile memory cells. Thus, information stored in memory cells 102 may be lost (e.g., invalid) if supply power (e.g., supply voltage Vcc) is disconnected from memory device 100. Hereinafter, Vcc is referred to as representing some voltage levels, however, they are not limited to a supply voltage (e.g., Vcc) of the memory device (e.g., memory device 100). For example, if the memory device (e.g., memory device 100) has an internal voltage generator (not shown in FIG. 1) that generates an internal voltage based on Vcc, such an internal voltage may be used instead of Vcc.

In a physical structure of memory device 100, each of memory cells 102 can include transistors (e.g., two transistor) formed vertically (e.g., stacked over each other in different layers) in different levels over a substrate (e.g., semiconductor substrate) of memory device 100. The structure of memory array 101, including memory cells 102, can include the structure of memory arrays and memory cells described below with reference to FIG. 2 through FIG. 10E.

As shown in FIG. 1, memory device 100 can include access lines 104 (e.g., "word lines") and data lines (e.g., bit lines) 105. Memory device 100 can use signals (e.g., word line signals) on access lines 104 to access memory cells 102 and data lines 105 to provide information (e.g., data) to be stored in (e.g., written) or read (e.g., sensed) from memory cells 102.

Memory device 100 can include an address register 106 to receive address information ADDR (e.g., row address signals and column address signals) on lines (e.g., address lines) 107. Memory device 100 can include row access circuitry (e.g., X-decoder) 108 and column access circuitry (e.g., Y-decoder) 109 that can operate to decode address information ADDR from address register 106. Based on decoded address information, memory device 100 can determine which memory cells 102 are to be accessed during a memory operation. Memory device 100 can perform a write operation to store information in memory cells 102, and a read operation to read sense) information (e.g., previously stored information) in memory cells 102. Memory device 100 can also perform an operation (e.g., a refresh operation) to refresh (e.g., to keep valid) the value of information stored in memory cells 102. Each of memory cells 102 can be configured to store information that can represent at most one bit (e.g., a single bit having a binary 0 ("0") or a binary 1 ("1"), or more than one bit (e.g., multiple bits having a combination of at least two binary bits).

Memory device 100 can receive a supply voltage, including supply voltages Vcc and Vss, on lines 130 and 132, respectively. Supply voltage Vss can operate at a ground potential (e.g., having a value of approximately zero volts). Supply voltage Vcc can include an external voltage supplied to memory device 100 from an external power source such as a battery or an alternating current to direct current (AC-DC) converter circuitry.

As shown in FIG. 1, memory device 100 can include a memory control unit 118, which includes circuitry (e.g., hardware components) to control memory operations (e.g., read and write operations) of memory device 100 based on control signals on lines (e.g., control lines) 120. Examples of signals on lines 120 include a row access strobe signal RAS*, a column access strobe signal CAS*, a write-enable signal WE*, a chip select signal CS*, a clock signal CK, and a clock-enable signal CKE. These signals can be part of signals provided to a DRAM device.

As shown in FIG. 1, memory device 100 can include lines (e.g., global data lines) 112 that can carry signals DQ0 through DQN. In a read operation, the value (e.g., "0" or "1") of information (read from memory cells 102) provided to lines 112 (in the form of signals DQ0 through DQN) can be based on the values of the signals on data lines 105. In a write operation, the value (e.g., "0" or "1") of the information provided to data lines 105 (to be stored in memory cells 102) can be based on the values of signals DQ0 through DQN on lines 112.

Memory device 100 can include sensing circuitry 103, select circuitry 115, and input/output (I/O) circuitry 116. Column access circuitry 109 can selectively activate signals on lines (e.g., select lines) based on address signals ADDR. Select circuitry 115 can respond to the signals on lines 114 to select signals on data lines 105. The signals on data lines 105 can represent the values of information to be stored in memory cells 102 (e.g., during a write operation) or the values of information read (e.g., sensed) from memory cells 102 (e.g., during a read operation).

I/O circuitry 116 can operate to provide information read from memory cells 102 to lines 112 (e.g., during a read operation) and to provide information from lines 112 (e.g., provided by an external device) to data lines 105 to be stored in memory cells 102 (e.g., during a write operation). Lines 112 can include nodes within memory device 100 or pins (or solder balls) on a package where memory device 100 can reside. Other devices external to memory device 100 (e.g., a hardware memory controller or a hardware processor) can communicate with memory device 100 through lines 107, 112, and 120.

Memory device 100 may include other components, which are not shown in FIG. 1 so as not to obscure the example embodiments described herein. At least a portion of memory device 100 (e.g., a portion of memory array 101) can include structures and operations similar to or identical to any of the memory devices described below with reference to FIG. 10E.

Figure 2:
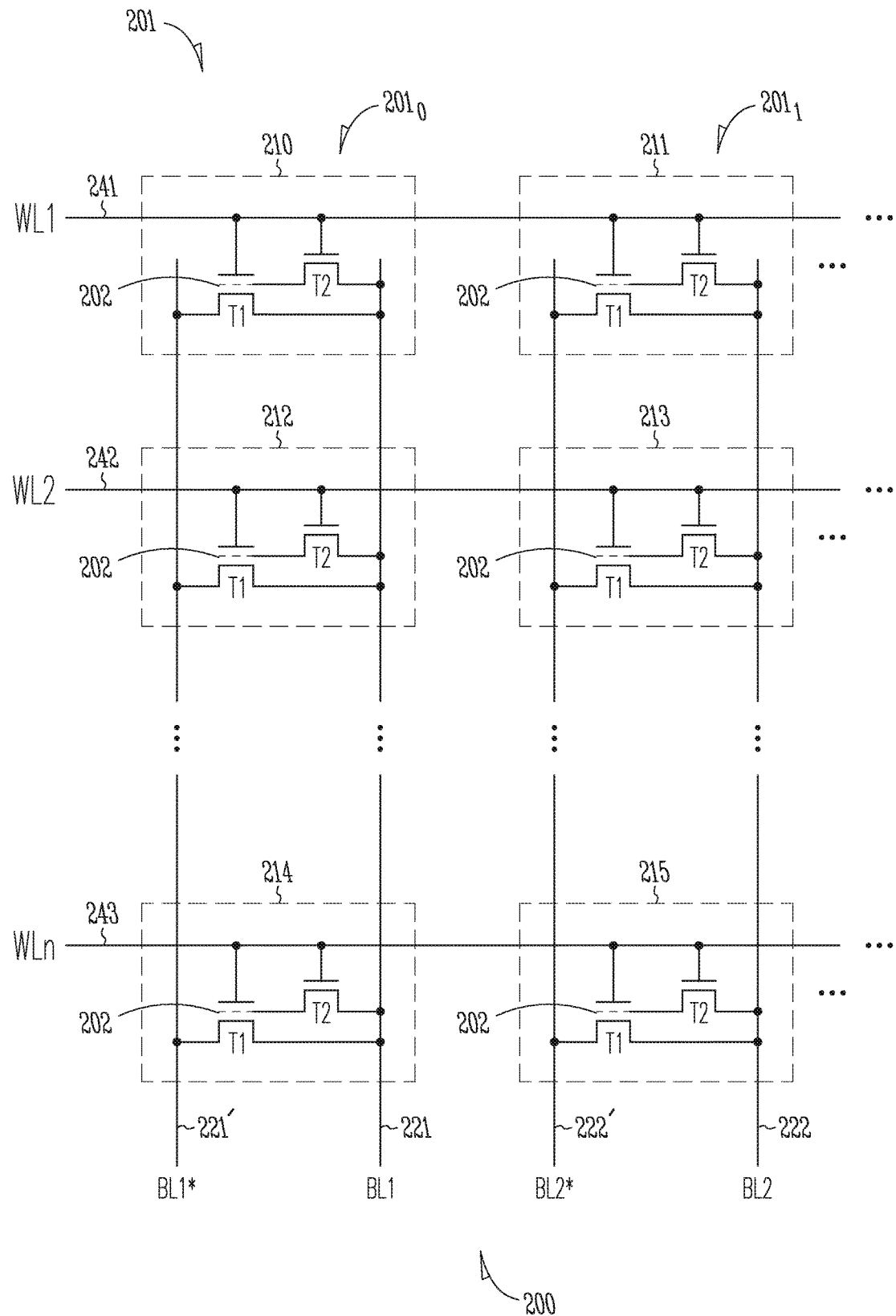
FIG. 2 shows a schematic diagram of a portion of a memory device including a memory array of two-transistor (2T) memory cells, according to some embodiments described herein.

FIG. 2 shows a schematic diagram of a portion of a memory device 200 including a memory array 201, according to some embodiments described herein. Memory device 200 can correspond to memory device 100 of FIG. 1. For example, memory array 201 can form part of memory array 101 of FIG. 1. As shown in FIG. 2, memory device 200 can include memory cells 210 through 215, which are volatile memory cells (e.g., DRAM cells). For simplicity, similar or identical elements among memory cells 210 through 215 are given the same labels.

Each of memory cells 210 through 215 can include two transistors T1 and T2. Thus, each of memory cells 210 through 215 can be called a 2T memory cell (e.g. 2T gain cell). Each of transistors T1 and T2 can include a field-effect transistor (FET). As an example, transistor T1 can be a p-channel FET (PFET), and transistor T2 can be an n-channel FET (NFET). Transistor T1 can include a charge-storage based structure (e.g., a floating-gate based). As shown in FIG. 2, each of memory cells 210 through 215 can include a charge storage structure 202, which can include the floating gate of transistor T1. Charge storage structure 202 can form the memory element of a respective memory cell among memory cells 210 through 215. Charge storage structure 202 can store charge. The value (e.g., "0" or "1") of information stored in a particular memory cell among memory cells 210 through 215 can be based on the amount of charge in charge storage structure 202 of that particular memory cell.

As shown in FIG. 2, transistor T2 (e.g., the channel region of transistor T2) of a particular memory cell among memory cells 210 through 215 can be electrically coupled to (e.g., directly coupled to) charge storage structure 202 of that particular memory cell. Thus, a circuit path (e.g., current path) can be formed directly between transistor T2 of a particular memory cell and charge storage structure 202 of that particular memory cell during an operation (e.g., a write operation) of memory device 200.

Memory cells 210 through 215 can be arranged in memory cell groups $201_0$ and $201_1$. FIG. 2 shows two memory cell groups (e.g., $201_0$ and $201_1$) as an example. However, memory device 200 can include more than two memory cell groups. Memory cell groups $201_0$ and $201_1$ can include the same number of memory cells. For example, memory cell group $201_0$ can include memory cells 210, 212, and 214, and memory cell group $201_1$ can include memory cells 211, 213, and 215. FIG. 2 shows three memory cells in each of memory cell groups $201_0$ and $201_1$ as an example. The number of memory cells in memory cell groups $201_0$ and $201_1$ can be different from three.

Memory device 200 can perform a write operation to store information in memory cells 210 through 215, and a read operation to read (e.g., sense) information from memory cells 210 through 215. Memory device 200 can be configured to operate as a DRAM device. However, unlike some conventional DRAM devices that store information in a structure such as a container for a capacitor, memory device 200 can store information in the form of charge in charge storage structure 202 (which can be a floating gate structure). As mentioned above, charge storage structure 202 can be the floating gate (e.g., floating gate 202) of transistor T1. Thus, memory device 200 can be called a floating-gate based DRAM device.

As shown in FIG. 2, memory device 200 can include access lines (e.g., word lines) 241, 242, and 243 that can carry respective signals (e.g., word line signals) WL1, WL2, and WLn. Access lines 241, 242, and 243 can be used to access both memory cell groups $201_0$ and $201_1$. Each of access lines 241, 242, and 243 can be structured as at least one conductive line (one conductive or multiple conductive lines that can be electrically coupled (e.g., shorted) to each other). Access lines 241, 242, and 243 can be selectively activated (e.g., activated one at a time) during an operation read or write operation) of memory device 200 to access a selected memory cell (or selected memory cells) among memory cells 210 through 215. A selected cell can be referred to as a target cell. In a read operation, information can be read from a selected memory cell (or selected memory cells). In a write operation, information can be stored in a selected memory cell (or selected memory cells).

In memory device 200, a single access line (e.g., a single word line) can be used to control (e.g., turn on or turn off) transistors T1 and T2 of a respective memory cell during either a read or write operation of memory device 200. Some conventional memory devices may use multiple (e.g., two separate) access lines to control access to a respective memory cell during read and write operations. In comparison with such conventional memory devices (that use multiple access lines for the same memory cell), memory device 200 uses a single access line (e.g., shared access line) in memory device 200 to control both transistors T1 and T2 of a respective memory cell to access the respective memory cell. This technique can save space and simplify operation of memory device 200.

In memory device 200, the gate of each of transistors T1 and T2 can be part of a respective access line (e.g., a respective word line). As shown in FIG. 2, the gate of each of transistors T1 and T2 of memory cell 210 can be part of access line 241. The gate of each of transistors T1 and T2 of memory cell 211 can be part of access line 241.

The gate of each of transistors T1 and T2 of memory cell 212 can be part of access line 242. The gate of each of transistors T1 and T2 of memory cells 213 can be part of access line 242.

The gate of each of transistors T1 and T2 of memory cell 214 can be part of access line 243. The gate of each of transistors T1 and T2 of memory cell 215 can be part of access line 243.

Memory device 200 can include data lines (e.g., bit lines) 221, 221', 222, and 222' that can carry respective signals (e.g., bit line signals) BL1, BL1*, BL2, and BL2*. During a read operation, memory device 200 can use data lines 221 and 221' to obtain information read (e.g., sense) from a selected memory cell of memory cell group $201_0$, and data lines 222 and 222' to read information from a selected memory cell of memory cell group $201_1$. During a write operation, memory device 200 can use data line 221 to provide information to be stored in a selected memory cell of memory cell group $201_0$, and data line 222 to provide information to be stored in a selected memory cell of memory cell group $201_1$.

Memory device 200 can include read paths (e.g., circuit paths). Information read from a selected memory cell during a read operation can be obtained through a read path coupled to the selected memory cell. In memory cell group $201_0$, a read path of a particular memory cell (e.g., 210, 212, or 214) can include a current path (e.g., read current path) through a channel region of transistor T1 of that particular memory cell and data lines 221 and 221'. In memory cell group $201_1$, a read path of a particular memory cell (e.g., 211, 213, or 215) can include a current path (e.g., read current path) through a channel region of transistor T1 of that particular memory cell and data lines 222 and 222'. In the example where transistor T1 is a PFET, the current can include a hole conduction (e.g., hole conduction in the direction from data line 221 to data line 221* through the channel region (e.g., n-type semiconductor region) of transistor T1). Since transistor T1 can be used in a read path to read information from the respective memory cell during a read operation, transistor T1 can be called a read transistor and the channel region of transistor T1 can be called a read channel region.

Memory device 200 can include write paths (e.g., circuit paths). Information to be stored in a selected memory cell during a write operation can be provided to the selected memory cell through a write path coupled to the selected memory cell. In memory cell group $201_0$, a write path of a particular memory cell can include transistor T2 (e.g., can include a write current path through a channel region of transistor T2) of that particular memory cell and data line 221. In memory cell group $201_1$, a write path of a particular memory cell (e.g., 211, 213, or 215) can include transistor T2 (e.g., can include a write current path through a channel region of transistor T2) of that particular memory cell and data line 222. In the example where transistor T2 is an NFET, the current can include an electron conduction (e.g., electron conduction in the direction from data line 221 to charge storage structure 202 through the channel region (e.g., n-type semiconductor region) of transistor T2). Since transistor T2 can be used in a write path to store information in a respective memory cell during a write operation, transistor T2 can be called a write transistor and the channel region of transistor T1 can be called a write channel region.

Each of transistors T1 and T2 can have a threshold voltage (Vt). Transistor T1 has a threshold voltage Vt1. Transistor T2 has a threshold voltage Vt2. The values of threshold voltages Vt1 and Vt2 can be different (unequal values). For example, the value of threshold voltage Vt2 can be greater than the value of threshold voltage Vt1. The difference in values of threshold voltages Vt1 and Vt2 allows reading (e.g., sensing) of information stored in charge storage structure 202 in transistor T1 on the read path without affecting (e.g., without turning on) transistor T2 on the write path (e.g., path through transistor T2). This can prevent leaking of charge from charge storage structure 202 through transistor T2 of the write path.

In a structure of memory device 200, transistors T1 and T2 can be formed (e.g., engineered) such that threshold voltage Vt1 of transistor T1 can be less than zero volts (e.g., Vt1<0V) regardless of the value (e.g., "0" or "1") of information stored in charge storage structure 202 of transistor T1, and Vt1<Vt2. Charge storage structure 202 can be in state "0" when information having a value of "0" is stored in charge storage structure 202. Charge storage structure 202 can be in state "1" when information having a value of "1" is stored in charge storage structure 202. Thus, in this structure, the relationship between the values of threshold voltages Vt1 and Vt2 can be expressed as follows, Vt1 for state "0"<Vt1 for state "1"<0V, and Vt2=0V (or alternatively Vt2>0V).

In an alternative structure of memory device 200, transistors T1 and T2 can be formed (e.g., engineered) such that Vt1 for state "0"<Vt1 for state "1", where Vt1 for state "0"<0V (or alternatively Vt1 for state "0"=0V), Vt1 for state "1">0V, and Vt1<Vt2.

In another alternative structure, transistors T1 and T2 can be formed (e.g., engineered) such that Vt1 (for state "0") <Vt1 (for state "1"), where Vt1 for state "0"=0V (or alternatively Vt1 for state "0">0V, and Vt1<Vt2.

During a read operation of memory device 200, only one memory cell of the same memory cell group can be selected at a time to read information from the selected memory cell. For example, memory cells 210, 212, and 214 of memory cell group $201_0$ can be selected one at a time during a read operation to read information from the selected memory cell (e.g., one of memory cells 210, 212, and 214 in this example). In another example, memory cells 211, 213, and 215 of memory cell group $201_1$ can be selected one at a time during a read operation to read information from the selected memory cell (e.g., one of memory cells 211, 213, and 215 in this example).

During a read operation, memory cells of different memory cell groups (e.g., memory cell groups $201_0$ and $201_1$) that share the same access line (e.g., access line 241, 242, or 243) can be concurrently selected (or alternatively can be sequentially selected). For example, memory cells 210 and 211 can be concurrently selected during a read operation to read (e.g., concurrently read) information from memory cells 210 and 211. Memory cells 212 and 213 can be concurrently selected during a read operation to read (e.g., concurrently read) information from memory cells 212 and 213. Memory cells 214 and 215 can be concurrently selected during a read operation to read (e.g., concurrently read) information from memory cells 214 and 215.

The value of information read from the selected memory cell of memory cell group $201_0$ during a read operation can be determined based on the value of a current detected (e.g. sensed) from a read path (described above) that includes transistor T1 of the selected memory cell (e.g., memory cell 210, 212, or 214) and data lines 221 and 221'. The value of information read from the selected memory cell of memory cell group $201_1$ during a read operation can be determined based on the value of a current detected (e.g. sensed) from a read path that includes transistor T1 of the selected memory cell (e.g., memory cell 211, 213, or 215) and data lines 222 and 222'.

Memory device 200 can include detection circuitry (not shown) that can operate during a read operation to detect (e.g., sense) a current (e.g., current I1, not shown) on a read path that includes data lines 221 and 221', and detect a current (e.g., current I2, not shown) on a read path that includes data lines 222 and 222'. The value of the detected current can be based on the value of information stored in the selected memory cell. For example, depending on the value of information stored in the selected memory cell of memory cell group $201_0$, the value of the detected current (e.g., the value of current I1) between data lines 221 and 221' can be zero or greater than zero. Similarly, depending on the value of information stored in the selected memory cell of memory cell group $201_1$, the value of the detected current (e.g., the value of current I2) between data lines 222 and 222' can be zero or greater than zero. Memory device 200 can include circuitry (not shown) to translate the value of a detected current into the value (e.g., "0", "1", or a combination of multi-bit values) of information stored in the selected memory cell.

During a write operation of memory device 200, only one memory cell of the same memory cell group can be selected at a time to store information in the selected memory cell. For example, memory cell 210, 212, and 214 of memory cell group $201_0$ can be selected one at a time during a write operation to store information in the selected memory cell (e.g., one of memory cell 210, 212, and 214 in this example). In another example, memory cells 211, 213, and 215 of memory cell group $201_1$ can be selected one at a time during a write operation to store information in the selected memory cell (e.g., one of memory cell 211, 213, and 215 in this example).

During a write operation, memory cells of different memory cell groups (e.g., memory cell groups $201_0$ and $201_1$) that share the same access line (e.g., access line 241, 242, or 243) can be concurrently selected. For example, memory cells 210 and 211 can be concurrently selected during a write operation to store (e.g., concurrently store) information in memory cells 210 and 211. Memory cells 212 and 213 can be concurrently selected during a write operation to store (e.g., concurrently store) information in memory cells 212 and 213. Memory cells 214 and 215 can be concurrently selected during a write operation to store (e.g., concurrently store) information in memory cells 214 and 215.

Information to be stored in a selected memory cell of memory cell group $201_0$ during a write operation can be provided through a write path (described above) that includes data line 221 and transistor T2 of the selected memory cell (e.g., memory cell 210, 212, or 214). Information to be stored in a selected memory cell of memory cell group $201_1$ during a write operation can be provided through a write path (described above) that includes data line 222 and transistor T2 of the selected memory cell (e.g., memory cell 212, 213, or 215). As described above, the value (e.g., binary value) of information stored in a particular memory cell among memory cells 210 through 215 can be based on the amount of charge in charge storage structure 202 of that particular memory cell.

In a write operation, the amount of charge in charge storage structure 202 of a selected memory cell can be changed (to reflect the value of information stored in the selected memory cell) by applying a voltage on a write path that includes transistor T2 of that particular memory cell and the data line (e.g., data line 221W or 222W) coupled to that particular memory cell. For example, a voltage having one value (e.g., 0V) can be applied on data line 221W (e.g., provide 0V to signal BL1) if information to be stored in a selected memory cell among memory cells 210, 212, and 214 has one value (e.g., "0"). In another example, a voltage having another value (e.g., a positive voltage) can be applied on data line 221 (e.g., provide a positive voltage to signal BL1) if information to be stored in a selected memory cell among memory cells 210, 212, and 214 has another value (e.g., "1"). Thus, information can be stored directly stored) in charge storage structure 202 of a particular memory cell by providing the information to be stored (e.g., in the form of a voltage) on a write path (that includes transistor T2) of that particular memory cell.

Figure 3:
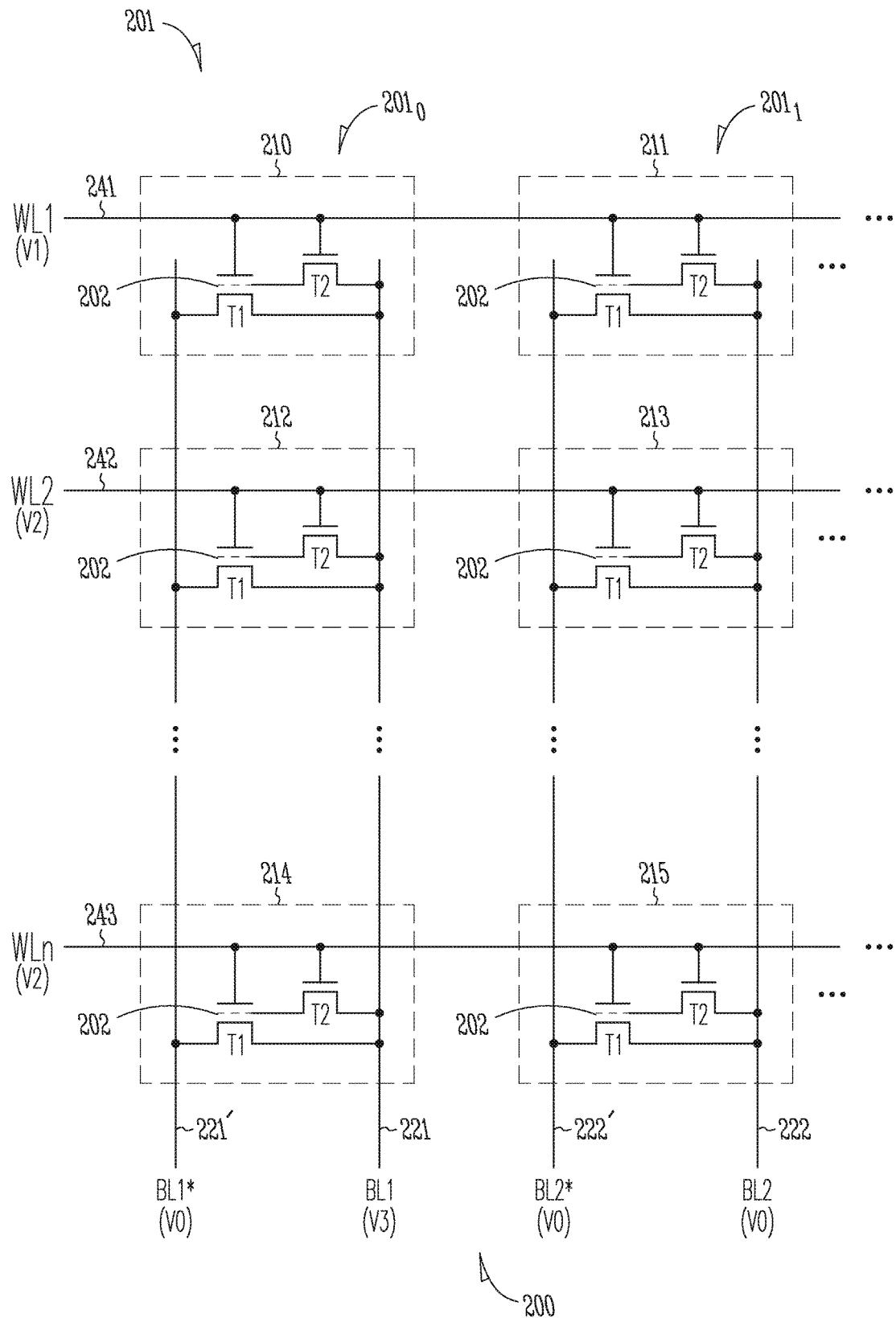
FIG. 3 shows the memory device of FIG. 2, including example voltages used during a read operation of the memory device, according to some embodiments described herein.

FIG. 3 shows memory device 200 of FIG. 2 including example voltages V0, V1, V2, and V3 used during a read operation of memory device 200, according to some embodiments described herein. The example of FIG. 3 assumes that memory cell 210 is a selected memory cell (e.g., target memory cell) during a read operation to read (e.g., to sense) information stored (e.g., previously stored) in memory cell 210. Memory cells 211 through 215 are assumed to be unselected memory cells. This means that memory cells 211 through 215 are not accessed and information stored in memory cells 211 through 215 are not read while information is read from memory cell 210 in the example of FIG. 3.

In FIG. 3, voltages V0, V1, V2, and V3 can represent different voltages applied to respective access lines 241, 242, and 243, and data lines 221, 221', 222, and 222' during a read operation of memory device 200. As an example, voltages V0, V1, V2, and V3 can have values of 0V (e.g., ground), −0.3V, −0.75V, and 0.5V, respectively. The specific values of voltages used in this description are only example values. Different values may be used.

In the read operation shown in FIG. 3, voltage V1 can have a value (voltage value) to turn on transistor T1 of memory cell 210 (a selected memory cell in this example)

and turn off (or keep off) transistor T2 of memory cell 210. This allows information to be read from memory cell 210. Voltage V0 and V2 and can have values, such that transistors T1 and T2 of each of memory cells 211 through 215 (unselected memory cells in this example) are turned off (e.g., kept off). Voltage V3 can have a value, such that a current (e.g., read current) may be formed on a read path that includes data lines 221 and 221' and transistor T1 of memory cell 210. This allows a detection of current on the read path coupled to memory cell 210. A detection circuitry (not shown) of memory device 200 can operate to translate the value of the detected current (during reading of information from a selected memory cell) into the value (e.g., "0", "1", or a combination of multi-bit values) of information read from the selected memory cell. In the example of FIG. 3, the value of the detected current on data lines 221 and 221' can be translated into the value of information read from memory cell 210.

In the read operation shown in FIG. 3, the voltages applied to respective access lines 241, 242, and 243 can cause transistors T1 and T2 of each of memory cells 211 through 215, except transistor T1 of memory cell 210, to turn off (or to remain turned off). Transistor T1 of memory cell 210 may or may not turn on, depending on the value of the threshold voltage Vt1 of transistor T1 of memory cell 210. For example, if transistor T1 of each of memory cells (e.g., 210 through 215) of memory device 200 is configured structured) such that the threshold voltage of transistor T1 is less than zero (e.g., Vt1<0V) regardless of the value (e.g., the state) of information stored in a respective memory cell 210, then transistor T1 of memory cell 210, in this example, can turn on and conduct a current between data lines 221 and 221' (through transistor T1 of memory cell 210). Memory device 200 can determine the value of information stored in memory cell 210 based on the value of the current between read data lines 221 and 221'. As described above, memory device 200 can include detection circuitry to measure the value of current between data lines 221 and 221' (or between data lines 222 and 222') during a read operation.

Figure 4:
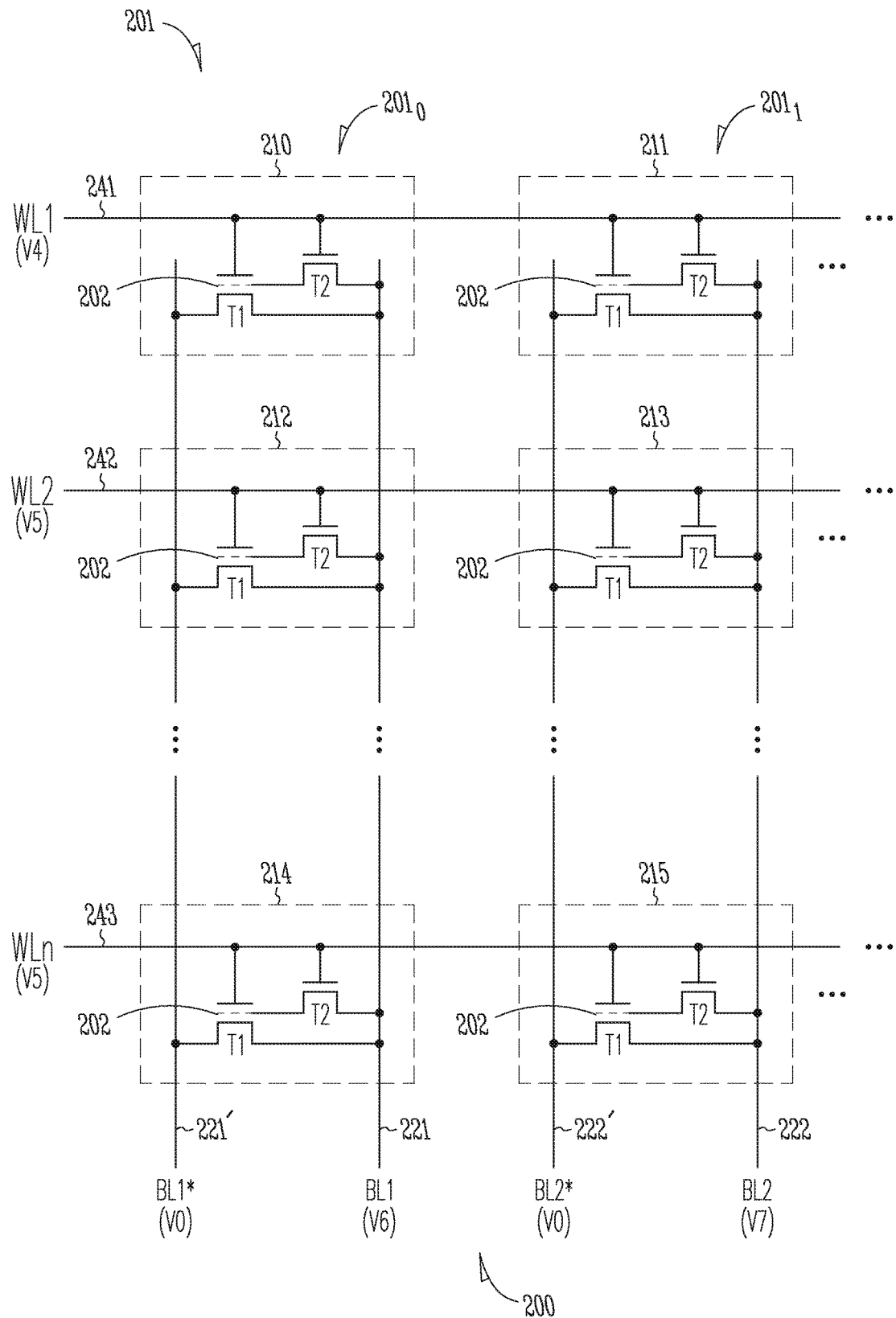
FIG. 4 shows the memory device of FIG. 2, including example voltages used during a write operation of the memory device, according to some embodiments described herein.

FIG. 4 shows memory device 200 of FIG. 2 including example voltages V0, V4, V5, V6, and V7 used during a write operation of memory device 200, according to some embodiments described herein. The example of FIG. 4 assumes that memory cells 210 and 211 are selected memory cells (e.g., target memory cells) during a write operation to store information in memory cells 210 and 211. Memory cells 212 through 215 are assumed to be unselected memory cells. This means that memory cells 212 through 215 are not accessed and information stored is not to be stored in memory cells 212 through 215 while information is stored in memory cells 210 and 211 in the example of FIG. 4.

In FIG. 4, voltages V0, V4, V5, V6, and V7 can represent different voltages applied to respective access lines 241, 242, and 243, and data lines 221, 221', 222, and 222' during a write operation of memory device 200. As an example, voltages V0, V4, and V5 can have values of 0V, 3.3V, and −0.75V. These values are example values. Different values may be used.

The values of voltages V6 and V7 can be the same or different depending on the value (e.g., "0" or "1") of information to be stored in memory, cells 210 and 211. For example, the values of voltages V6 and V7 can be the same (e.g., V6=V7) if the memory cells 210 and 211 are to store information having the same value. As an example, V6=V7=0V if information to be stored in each memory cell 210 and 211 is "0", and V6=V7=1V to 3V if information to be stored in each memory cell 210 and 211 is "1").

In another example, the values of voltages V6 and V7 can be different (e.g., V6≠V7) if the memory cells 210 and 211 are to store information having different values. As an example, V6=0V and V7=1V to 3V if "0" to be stored in memory cell 210 and "1" is to be stored in memory cell 211). As another example, V6=1V to 3V and V7=0V if "1" is to be stored in memory cell 210 and "0" is to be stored in memory cell 211).

The range of voltage of 1V to 3V is used here as an example. A different range of voltages can be used. Further, instead of applying 0V (e.g., V6=0V or V7=0V) to a particular write data line (e.g., data line 221W or 222W) for storing information having a value of "0" to the memory cell (e.g., memory cell 210 or 211) coupled to that particular write data line, a positive voltage (e.g., V6>0V or V7>0V) may be applied to that particular data line.

In a write operation of memory device 200 of FIG. 4, voltage V5 can have a value, such that transistors T1 and T2 of each of memory cells 212 through 215 (unselected memory cells, in this example) are turned off (e.g., kept off). Voltage V4 can have a value to turn on transistor T2 of each of memory cells 210 and 211 (selected memory cells, in this example) and form a write path between charge storage structure 202 of memory cell 210 and data line 221, and a write path between charge storage structure 202 of memory cell 211 and data line 222. A current (e.g., write current) may be formed between charge storage structure 202 of memory cell 210 and data line 221. This current can affect (e.g., change) the amount of charge on charge storage structure 202 of memory cell 210 to reflect the value of information to be stored in memory cell 210. A current (e.g., another write current) may be formed between charge storage structure 202 of memory cell 211 and data line 222. This current can affect (e.g., change) the amount of charge on charge storage structure 202 of memory cell 211 to reflect the value of information to be stored in memory cell 211.

In the example write operation of FIG. 4, the value of voltage V6 may cause charge storage structure 202 of memory cell 210 to discharge or to be charged, such that the resulting charge (e.g., charge remaining after the discharge or charge action) on charge storage structure 202 of memory cell 210 can reflect the value of information stored in memory cell 210. Similarly, the value of voltage V7 in this example may cause charge storage structure 202 of memory cell 211 to discharge or to be charged, such that the resulting charge (e.g., charge remaining after the discharge or charge action) on charge storage structure 202 of memory cell 211 can reflect the value of information stored in memory cell 211.

Figure 5:
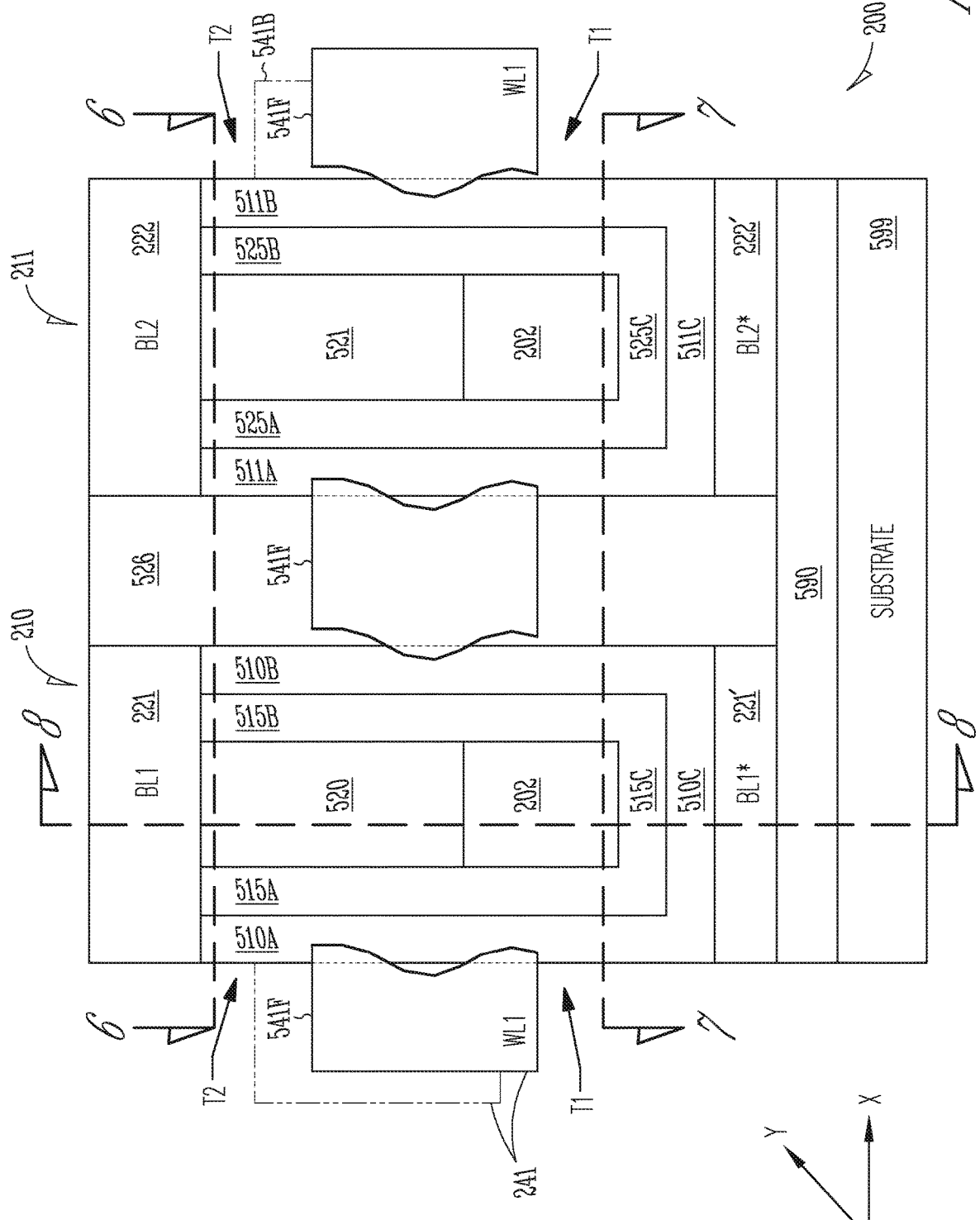
FIG. 5, FIG. 6, FIG. 7, and FIG. 8 show different views of a structure of the memory device of FIG. 2, according to some embodiments described herein.
Figure 6:
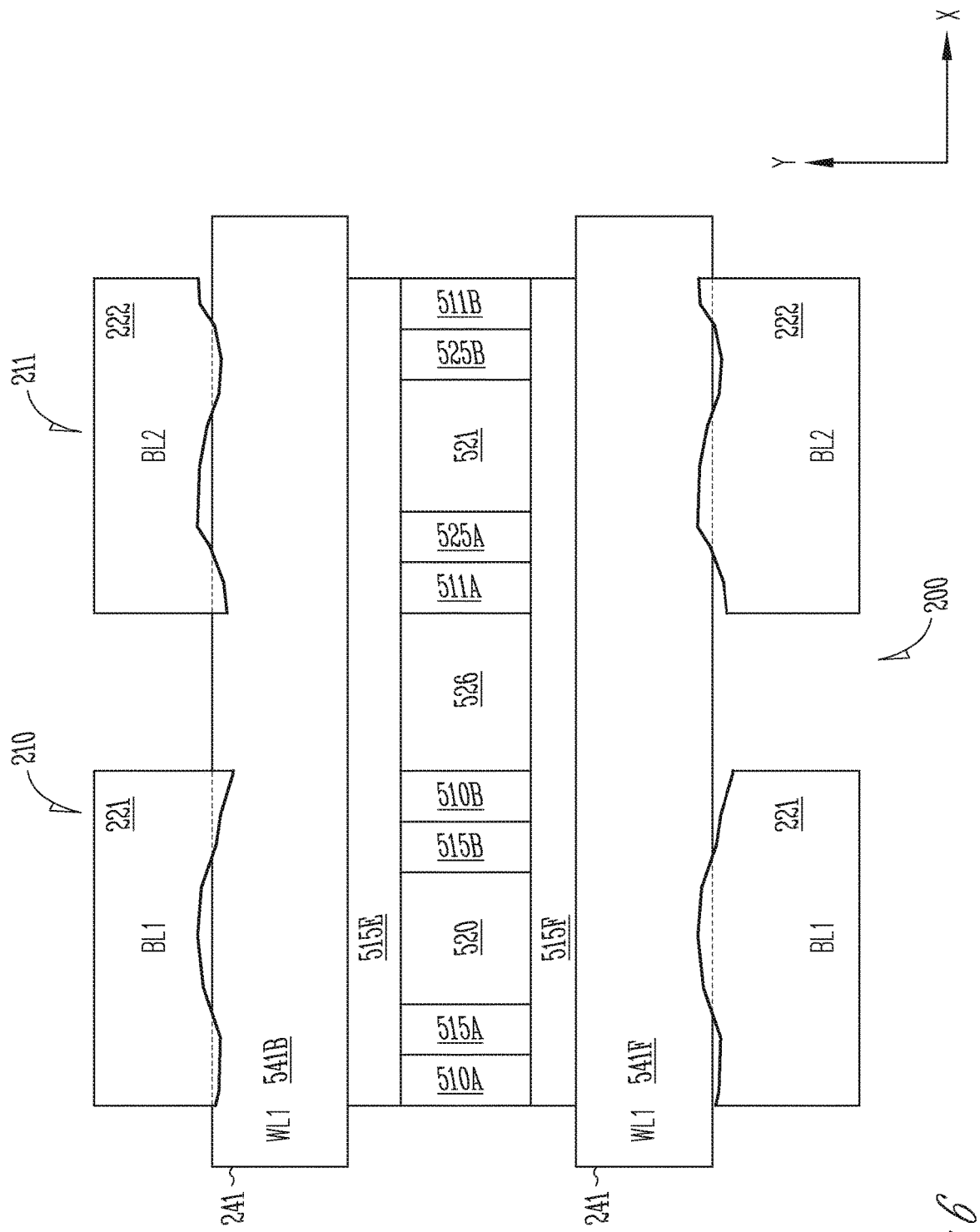
Figure 7:
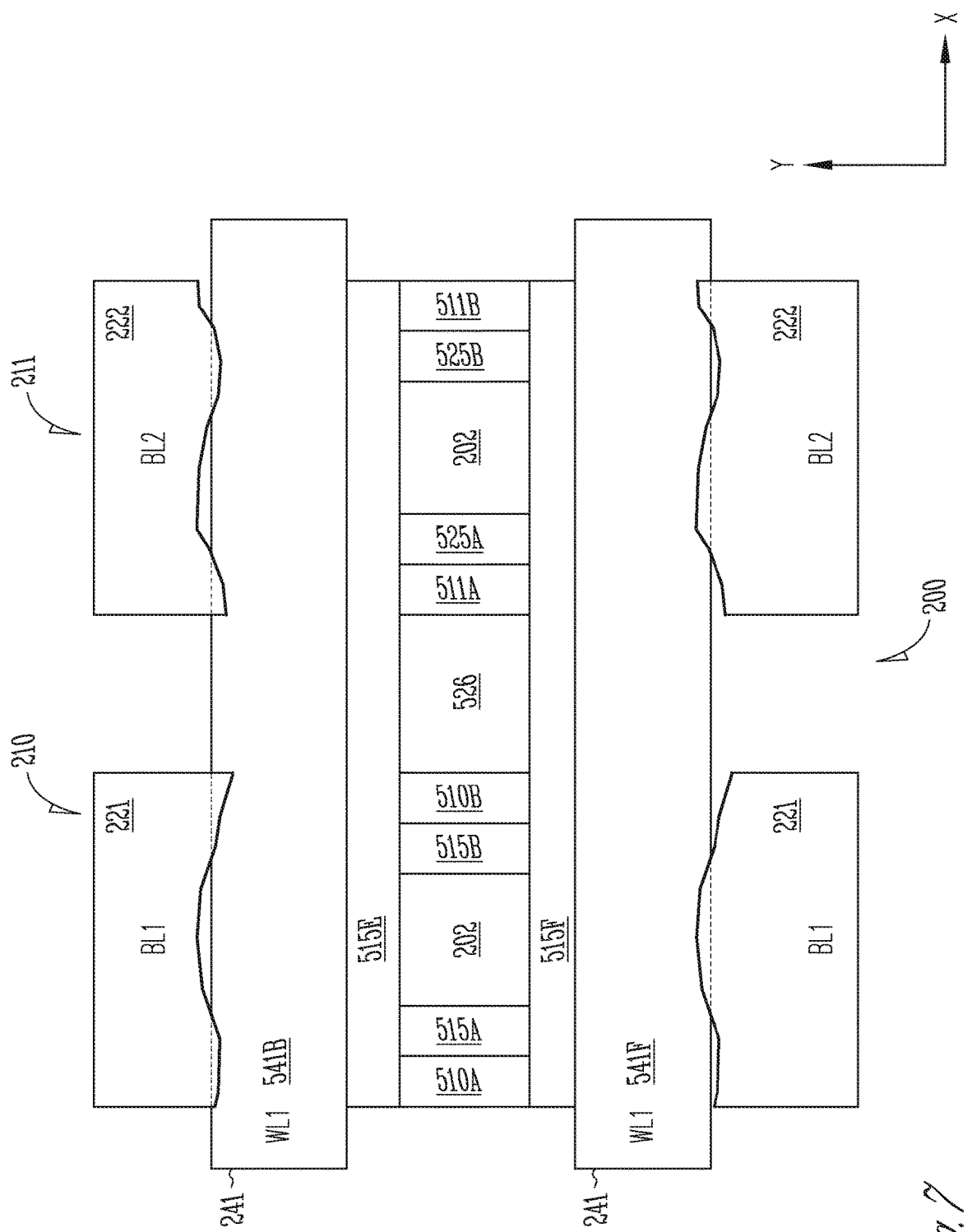
Figure 8:
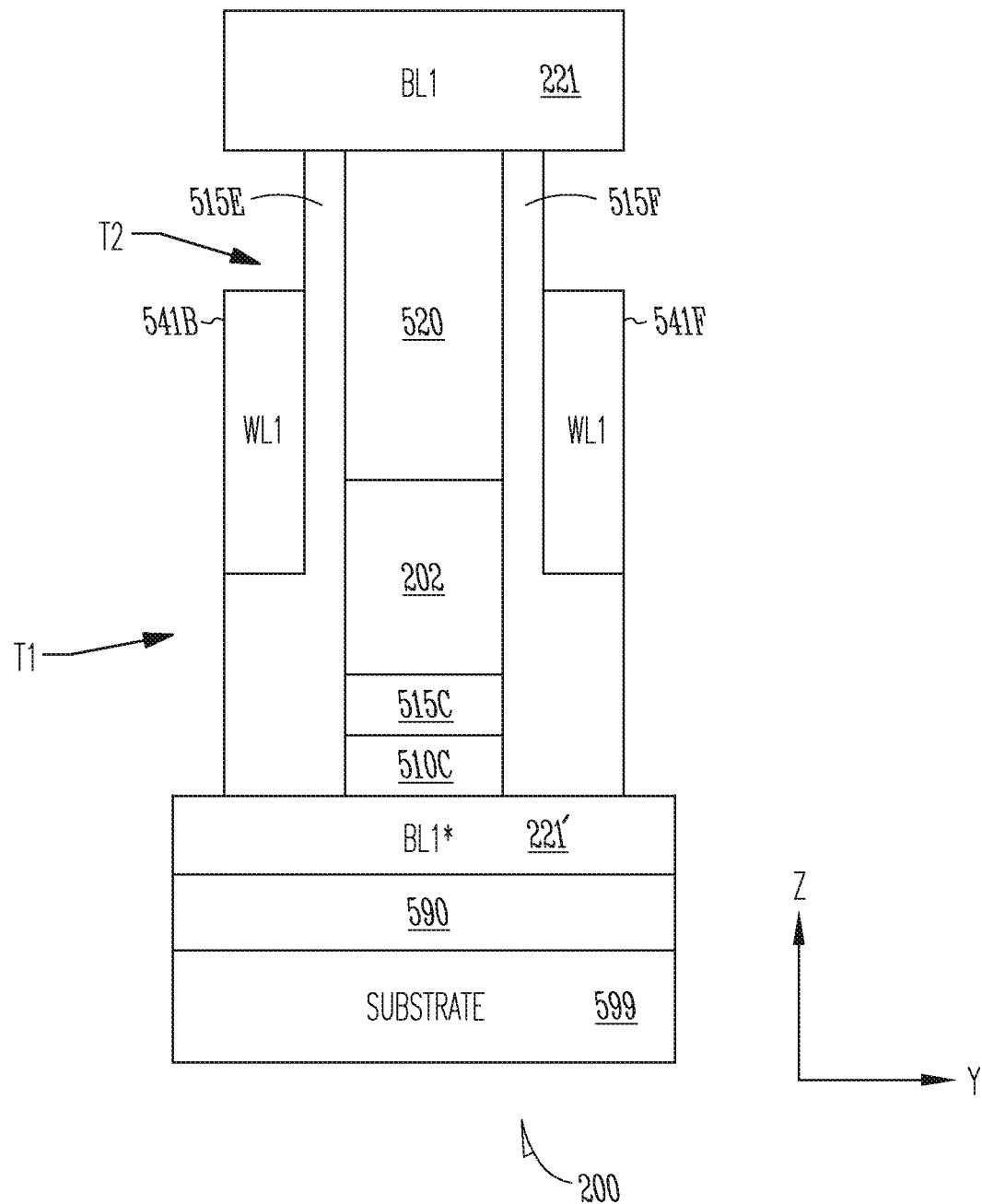

FIG. 5, FIG. 6, FIG. 7, and FIG. 8 show different views of a structure of memory device 200 of FIG. 2 with respect to the X, Y, and Z directions, according to some embodiments described herein. FIG. 5 shows a side view of memory device 200 with respect to the X-Z directions. FIG. 6, FIG. 7, and FIG. 8 show views taken along lines 6-6, 7-7, and 8-8, respectively, of FIG. 5.

For simplicity, FIG. 5 through FIG. 8 focus on the structure of memory cells 210 and 211. The structures of other memory cells (e.g., memory cells 212, 213, 214, and 215) of memory device 200 of FIG. 2 can be similar to or identical to the structures of memory cells 210 and 211 shown in FIG. 5. In FIG. 5 through FIG. 8 (which show the physical structure of memory device 200) and FIG. 2 (which shows memory device 200 in circuit schematic form), the same elements are given the same reference numbers.

The following description refers to FIG. 5 through FIG. 8. For simplicity, detailed description of the same element is not repeated in the description of FIG. 5 through FIG. 8. Also for simplicity, cross-sectional lines (e.g., hatch lines) are omitted from most of the elements shown in FIG. 5 through FIG. 8 and other figures (e.g., FIG. 9A through FIG. 10E) in the drawings described herein. Some elements of memory device 200 may be omitted from a particular figure of the drawings so as to not obscure the description of the element being described in that particular figure. The dimensions of the elements shown in FIG. 5 through FIG. 10E are not scaled.

As shown in FIG. 5, memory device 200 can include a substrate 599 over which memory cells 210 and 211 can be formed (e.g., formed vertically with respect to substrate 599). Substrate 599 can be a semiconductor substrate (e.g., silicon-based substrate) or other types of substrates. The Z-direction can be a direction perpendicular to substrate 599 (e.g., a vertical direction relative to substrate 599). The X-direction and the Y-direction are perpendicular to each other and perpendicular to the Z-direction.

As shown in FIG. 5 through FIG. 8, each of data lines 221, 221', 222, and 222' (associated with signals BL1, BL1*, BL2, and BL2*, respectively) can have a length in the Y-direction, a width in the X-direction, and a thickness in the Z-direction. Each of data lines data lines 221, 221', 222, and 222' can include a conductive material (or a combination of materials) that can be structured as a conductive line (e.g., conductive region). Example materials for data lines 221, 221', 222, and 222' include metal, conductively doped poly-silicon, or other conductive materials.

As shown in FIG. 5, data lines 221 and 221' can include respective conductive regions (part of respective conductive materials that form data lines 221 and 221') located in different levels (with respect to the Z-direction) of memory device 200 and electrically separated from each other. Similarly, data lines 222 and 222' can include respective conductive regions (part of respective conductive materials that form data lines 222 and 222') located in different levels of memory device 200 and electrically separated from each other.

Data lines 221 and 221' can be bottom and top data lines (with respect to substrate 599 and the Z-direction), respectively. Memory cell 210 can be located between and coupled to memory cell 211. Data lines 222 and 222' can be bottom and top data lines (with respect to substrate 599 and the Z-direction), respectively. Memory cell 211 can be located between and coupled to memory cell 210.

Access line 241 (associated with signal WL1) can be structured by (can include) a combination of portions 541F and 541B (e.g., front and back conductive portions with respect to the Y-direction). Each of portions 541F and 541B can include a conductive material (or a combination of materials) that can be structured as a conductive line (e.g., conductive region) having a length extending continuously in the X-direction. In FIG. 5, portions 541A, 541B, 541C, and 541D are partially shown to avoid obstructing some parts of the other elements of memory device 200.

Each of portions 541F and 541B can include a piece (e.g., a layer) of conductive material (e.g., metal, conductively doped polysilicon, or other conductive materials). Each of portions 541F and 541B can have a length (shown in FIG. 5) in the X-direction, a width (shown in FIG. 5) in the Z-direction, and a thickness (shown in FIG. 8) in the Y-direction.

Portions 541F and 541B can be electrically coupled to each other. For example, memory device 200 can include a conductive material (e.g., not shown) that can contact (e.g., electrically couple to) portions 541F and 541B, such that portions 541F and 541B (which are part of a single access line 241) can be concurrently applied by the same signal (e.g., signal WL1).

In an alternative structure of memory device 200, either portion 541F or portion 541B can be omitted, such that access line 241 can include only either portion 541F or portion 541B. In the structure shown in FIG. 5, including two portions 541F and 541B can help better control transistor T1 (e.g., transistor T1, shown schematically in FIG. 2) of each of memory cell 210 and 211 during a read operation).

As shown in FIG. 5, memory device 200 can include a dielectric 590 formed over a portion of substrate 599. Dielectric 590 can include silicon oxide. Dielectric 590 can electrically separate data lines 221' and 222' from substrate 599.

Charge storage structure 202 can include a piece (e.g., a layer) of semiconductor material (e.g., polysilicon), a piece (e.g., a layer) of metal, or a piece of material (or materials) that can trap charge. The materials for charge storage structure 202 and portions 541F and 541B of access line 241 can be the same or can be different. As shown in FIG. 5, charge storage structure 202 can be located over data line 221' and can be closer (e.g., extend in the Z-direction closer) to substrate 599 than each of portions 541F and 541B of access line 241.

FIG. 5 shows an example where the top edge of charge storage structure 202 is at a specific distance (e.g., distance shown in FIG. 5) from the edge (e.g., bottom edge) of each of portions 541F and 541B of access line 241. However, the distance between the top edge of charge storage structure 202 and the edge (e.g., bottom edge) of each of portions 541F and 541B may vary.

FIG. 5 shows an example where portions 541F and 541B overlap (in the Z-direction) charge storage structure 202. However, portions 541F and 541B may not overlap charge storage structure 202.

Memory device 200 can include material 520 located between data line 221 and charge storage structure 202. As shown in FIG. 5, material 520 can be electrically coupled to data line 221 and charge storage structure 202 of memory cell 210. As described above, charge storage structure 202 of memory cell 210 can form the memory element of memory cell 210. Thus, memory cell 210 can include a memory element (which is charge storage structure 202) located between substrate 599 and material 520 with respect to the Z-direction and the memory element contacts (e.g., directly coupled to) material 520.

Material 520 can form a source (e.g., source terminal), a drain (e.g., drain terminal), a channel region (e.g., write channel region) between the source and the drain of transistor T2 of memory cell 210. Thus, as shown in FIG. 5, the source, channel region, and the drain of transistor T2 of memory cell 210 can be formed from a single piece of the same material (or alternatively, a single piece of the same combination of materials) such as material 520. Therefore, the source, the drain, and the channel region of transistor T2 of memory cell 210 can be formed from the same material (e.g., material 520) of the same conductivity type (e.g., either n-type or p-type).

Memory device 200 can include material 521 that can form a source (e.g., source terminal), a drain (e.g., drain terminal), and a channel region (e.g., write channel region) between the source and the drain of transistor T2 of memory cell 211. Thus, as shown in FIG. 5, the source, channel region, and the drain of transistor T2 of memory cell 211 can be formed from a single piece of the same material (or alternatively, a single piece of the same combination of materials) such as material 521.

Materials 520 and 521 can be the same. For example, each of materials 520 and 521 can include a piece (e.g., a layer) of semiconductor material. In the example where the transistor is a PFET (as described above), Materials 520 and 521 can include p-type semiconductor material (e.g., p-type silicon).

In another example, the semiconductor material that forms material 520 or material 521 can include a piece of oxide material. Examples of the oxide material used for materials 520 and 521 include semiconducting oxide materials, transparent conductive oxide materials, and other oxide materials.

As an example, each of materials 520 and 521 can include at least one of zinc tin oxide (ZTO), indium zinc oxide (IZO), zinc oxide ($ZnO_x$), indium gallium zinc oxide (IGZO), indium gallium silicon oxide (IGSO), indium oxide ($InO_x$, $In_2O_3$), tin oxide ($SnO_2$), titanium oxide (TiOx), zinc oxide nitride ($Zn_xO_yN_z$), magnesium zinc oxide ($Mg_xZn_yO_z$), indium zinc oxide ($In_xZn_yO_z$), indium gallium zinc oxide ($In_xGa_yZn_zO_a$), zirconium indium zinc oxide ($Zr_xIn_yZn_zO_a$), hafnium indium zinc oxide ($Hf_xIn_yZn_zO_a$), tin indium zinc oxide ($Sn_xIn_yZn_zO_a$), aluminum tin indium zinc oxide ($Al_xSn_yIn_zZn_aO_d$), silicon indium zinc oxide ($Si_xIn_yZn_zO_a$), zinc tin oxide ($Zn_xSn_yO_z$), aluminum zinc tin oxide ($Al_xZn_ySn_zO_a$), gallium zinc tin oxide ($Ga_xZn_ySn_zO_a$), zirconium zinc tin oxide ($Zr_xZn_ySn_zO_a$), indium gallium silicon oxide (InGaSiO), and gallium phosphide (GaP).

Using the material listed above in memory device 200 provides improvement and benefits for memory device 200. For example, during a read operation, to read information from a selected memory cell (e.g., memory cell 210 or 211), charge from charge storage structure 202 of the selected memory cell may leak to transistor T2 of the selected memory cell. Using the material listed above for the channel region (e.g., material 520 or 521) of transistor T2 can reduce or prevent such a leakage. This improves the accuracy of information read from the selected memory cell and improves the retention of information stored in the memory cells of the memory device (e.g., memory device 200) described herein.

The materials listed above are examples of materials 520 and 521. However, other materials (e.g., a relatively high band-gap material) different from the above-listed materials can be used.

In FIG. 5, material 520 and charge storage structure 202 of memory cell 210 can be electrically coupled directly coupled) to each other, such that material 520 can contact charge storage structure 202 of memory cell 210 without an intermediate material (e.g., without a conductive material) between charge storage structure 202 of memory cell 210 and material 520. In another example, material 520 can be electrically coupled to charge storage structure 202 of memory cell 210, such that material 520 is not directly coupled to (not contacting) charge storage structure 202 of memory cell 210, but material 520 is coupled to (e.g., indirectly contacting) charge storage structure 202 of memory cell 210 through an intermediate material (e.g., a conductive material, not shown in FIG. 5) between charge storage structure 202 of memory cell 210 and material 520.

As shown in FIG. 5, memory cell 210 can include portions 510A, 510B, and 510C electrically coupled to each other. Each of portions 510A, 510B, and 510C can include a piece of semiconductor material. Example materials for each of portions 510A, 510B, and 510C include silicon, polysilicon (e.g., undoped or doped polysilicon), germanium, silicon-germanium, or other semiconductor materials.

Each of portions 511A and 510B can have a length extending in the Z-direction. Portion 510C can have a length in the X-direction. As shown in FIG. 5, portions 510A, 510B, and 510C can form a "U" shape (or close to a "U" shape).

As described above with reference to FIG. 2, transistor T1 of memory cell 210 includes a channel region (e.g., read channel region). In FIG. 5, the channel region of transistor T1 of memory cell 210 can include (e.g., can be formed from a combination of) portions 510A, 510B, and 510C. Portions 510A, 510B, and 5100 can be electrically coupled to data lines 221 and 222. As described above with reference to FIG. 2, memory cell 210 can include a read path. In FIG. 5, portions 510A, 510B, and 510C (e.g., the read channel region of transistor T1 of memory cell 210) can be part of the read path of memory cell 210 that can carry a current (e.g., read current) during a read operation of reading information from memory cell 210. For example, during a read operation, to read information from memory cell 210, portions 510A, 510B, and 510C can conduct a current (e.g., read current) between data lines 221 and 221'. The direction of the read current can be from data line 221 to data line 221' (through portions 510A, 510B, and 510). In the example where transistor T1 is a PFET and transistor T2 is an NFET, the material that forms portions 510A, 510B, and 510C can have a different conductivity type from material 520 or 521. For example, portions 510A 510B, and 510C can include p-type semiconductor material (e.g., p-type silicon), and materials 520 and 521 can include n-type semiconductor material (e.g., n-type gallium phosphide (GaP)).

Memory cell 210 can include dielectrics 515A, 515B, and 515C. Dielectrics 515A, 515B, and 515C can be gate oxide regions that electrically separate charge storage structure 202 from portions 510A, 510B, and 510C, and electrically separate material 520 from portions 510A, 510B, and 510C. Example materials for dielectrics 515A, 515B, and 515C can include silicon dioxide, hafnium oxide (e.g., $HfO_2$), aluminum oxide (e.g., (e.g., $Al_2O_3$), or other dielectric materials.

As shown in FIG. 5, part of portion 541F can span across (e.g., overlap in the X-direction) part of portions 510A and 510B and part of material 520. As described above, portions 510A and 510B can form part of read channel region of transistor T1 and material 520 can form part of write channel region of transistor T2. Thus, as shown in FIG. 5, part of portion 541F can span across (e.g., overlap) part of (e.g., on a side (e.g., front side) in the Y-direction) both read and write channels of transistors T1 and T2, respectively. Although hidden from the view shown in FIG. 5, part of portion 541B can span across (e.g., overlap in the X-direction) part of (e.g., on another side (e.g., back side opposite from the front side) in the Y-direction) portions 510A and 510B and a part of material 521. As shown in FIG. 5, access line 241 can also span across (e.g., overlap in the X-direction) part of portions 511A and 511B (e.g., a portion of the read channel region of transistor T1 of memory cell 211) and part of material 521 (e.g., a portion of write channel region of transistor T2 of memory cell 211).

The spanning (e.g., overlapping) of access line 241 across portions 510A and 510B and material 520 allows access line 241 (a single access line) to control (e.g., to turn on or turn off) both transistors T1 and T2 of memory cell 210 and both transistors of memory cell 211. Similarly, the spanning (e.g., overlapping) of access line 241 across portions 511A and 511B and material 521 allows access line 241 (a single access line) to control (e.g., turn on or turn off) both transistors T1 and T2 of memory cell 211.

As shown in FIG. 6 through FIG. 8, memory device 200 can include dielectrics 515E and 515F (e.g., oxide regions) to electrically separate portions 541F and 541B of access line 241 from other elements (e.g., from portions 510A, 510B, 510C, 510D, and 510E (e.g., read channel regions) and from charge storage structure 202) of memory cells 210 and 211. Example materials for portions 515E and 515F can include silicon dioxide, hafnium oxide (e.g., $HfO_2$), aluminum oxide (e.g., (e.g., $Al_2O_3$), or other dielectric materials.

The dielectric material (or materials) separating portions 510A, 510B, 510C, 511A, 511B, and 511C (the read channel regions) and from portions 541F and 541B of access line 214 can be the same as (or alternatively, different from) the material (or materials) separating charge storage structure 202 from portions 541F and 541B. Further, the thickness of the dielectric material (or materials) separating portions 510A, 510B, 510C, 511A, 511B, and 511C (the read channel regions) from portions 541F and 541B of access line 214 can be the same as (or alternatively, different from) the thickness of the material (or materials) separating charge storage structure 202 from portions 541F and 541E of access line 214.

As shown in FIG. 8, portions 541F and 541B can be adjacent respective sides of material 520 and charge storage structure 202 of memory cell 210. For example, portion 541F can be adjacent a side (e.g., right side in the X-direction in the view of FIG. 8) of a portion of each of material 520 and charge storage structure 202. In another example, portion 541B can be adjacent another side (e.g., left side (opposite from the right side) in the X-direction in the view of FIG. 8) of a portion of each of material 520 and charge storage structure 202.

The above description focuses on the structure of memory cell 210. Memory cell 211 can include elements structured in ways similar or identical to the elements of memory cell 210, described above. For example, as shown in FIG. 5 through FIG. 7, memory cell 211 can include charge storage structure 202, channel region (e.g., write channel region) 521, portions 511A, 511B, and 511C (e.g., read channel region), and dielectrics 525A, 525B, and 525C. The material (or materials) for dielectrics 525A, 525B, and 525C can the same as the material (or materials) for dielectrics 515A, 515B, and 515C, respectively.

Figure 9B:
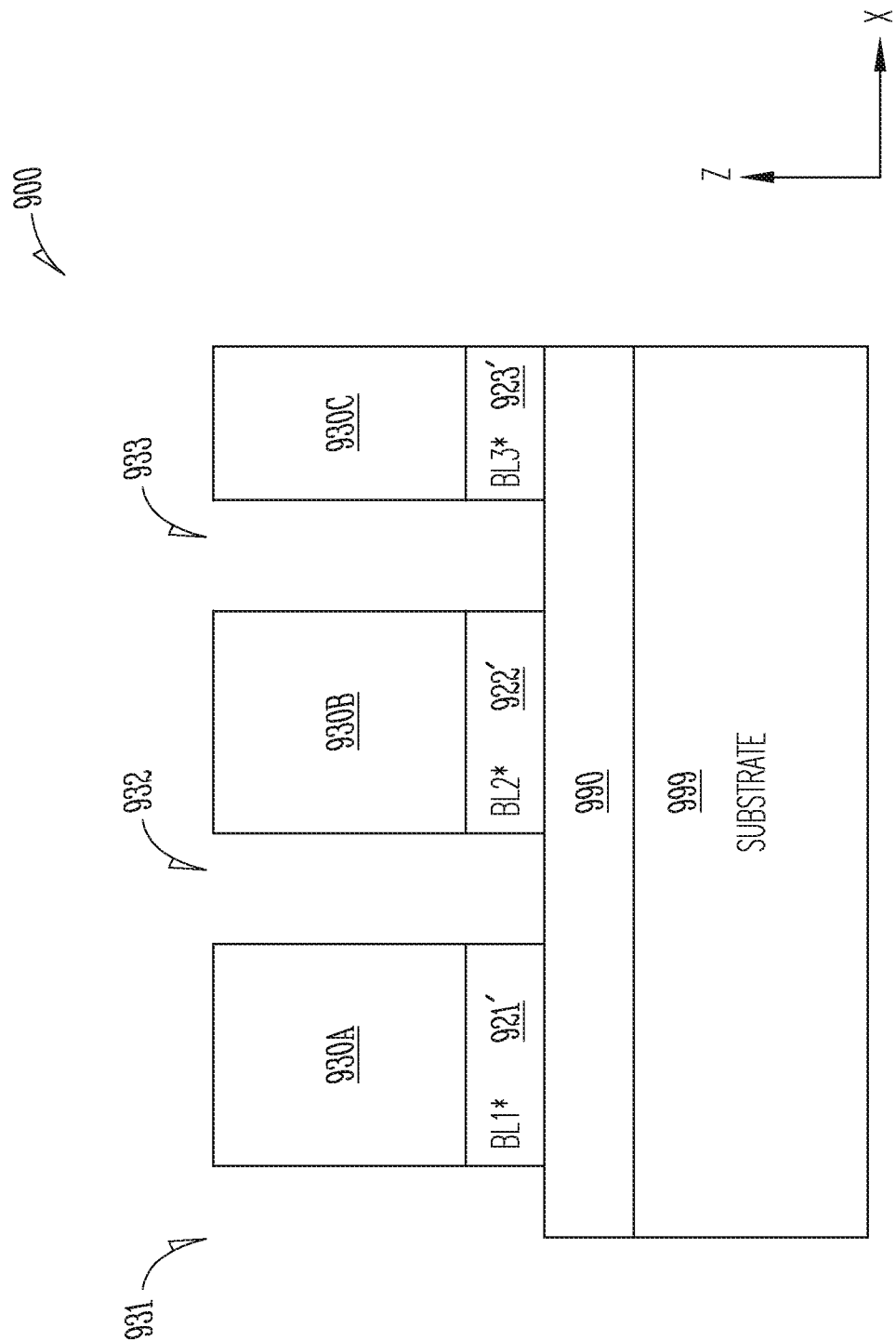
FIG. 9A through FIG. 9R show processes of forming a memory device, according to some embodiments described herein.
Figure 9D:
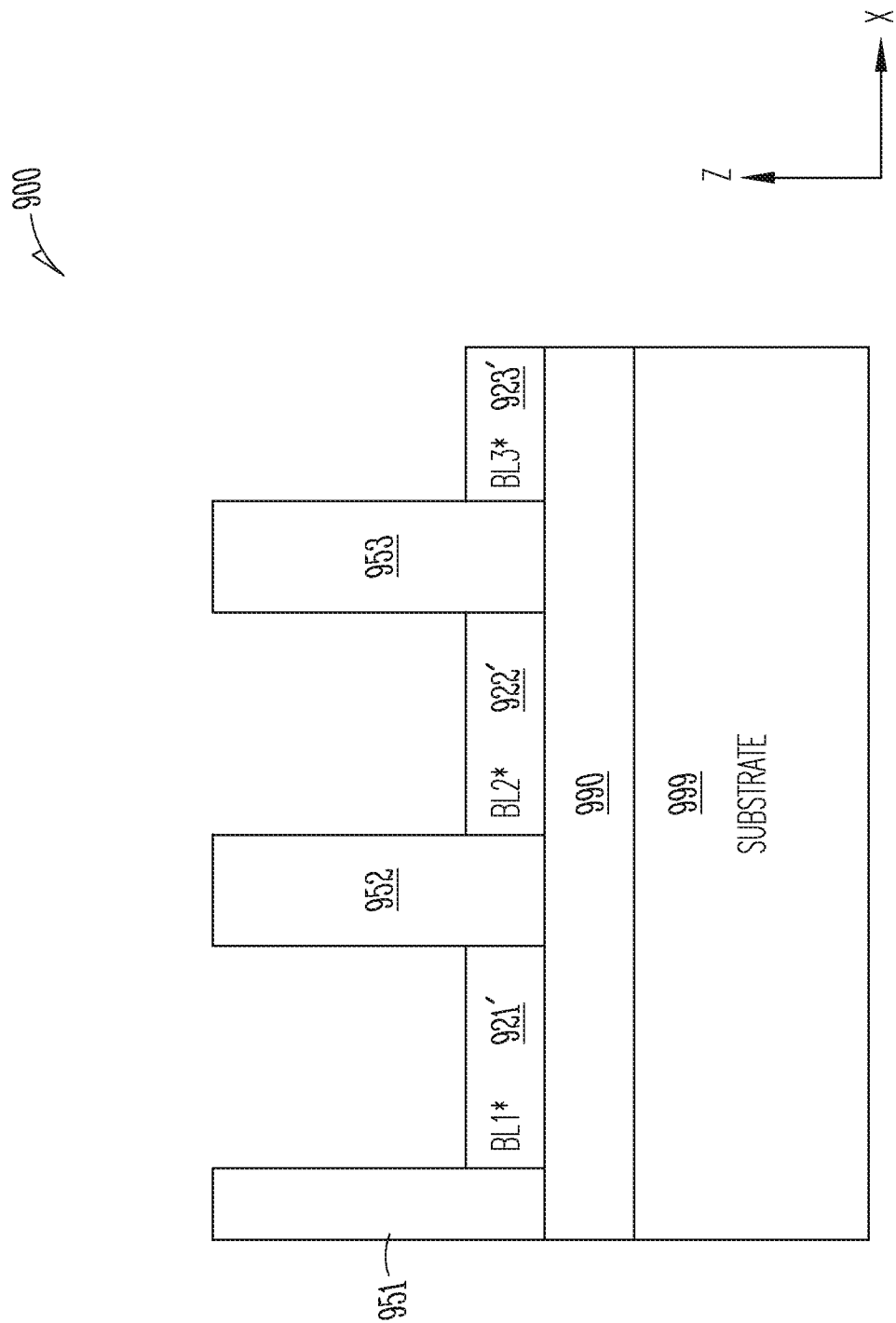
Figure 9H:
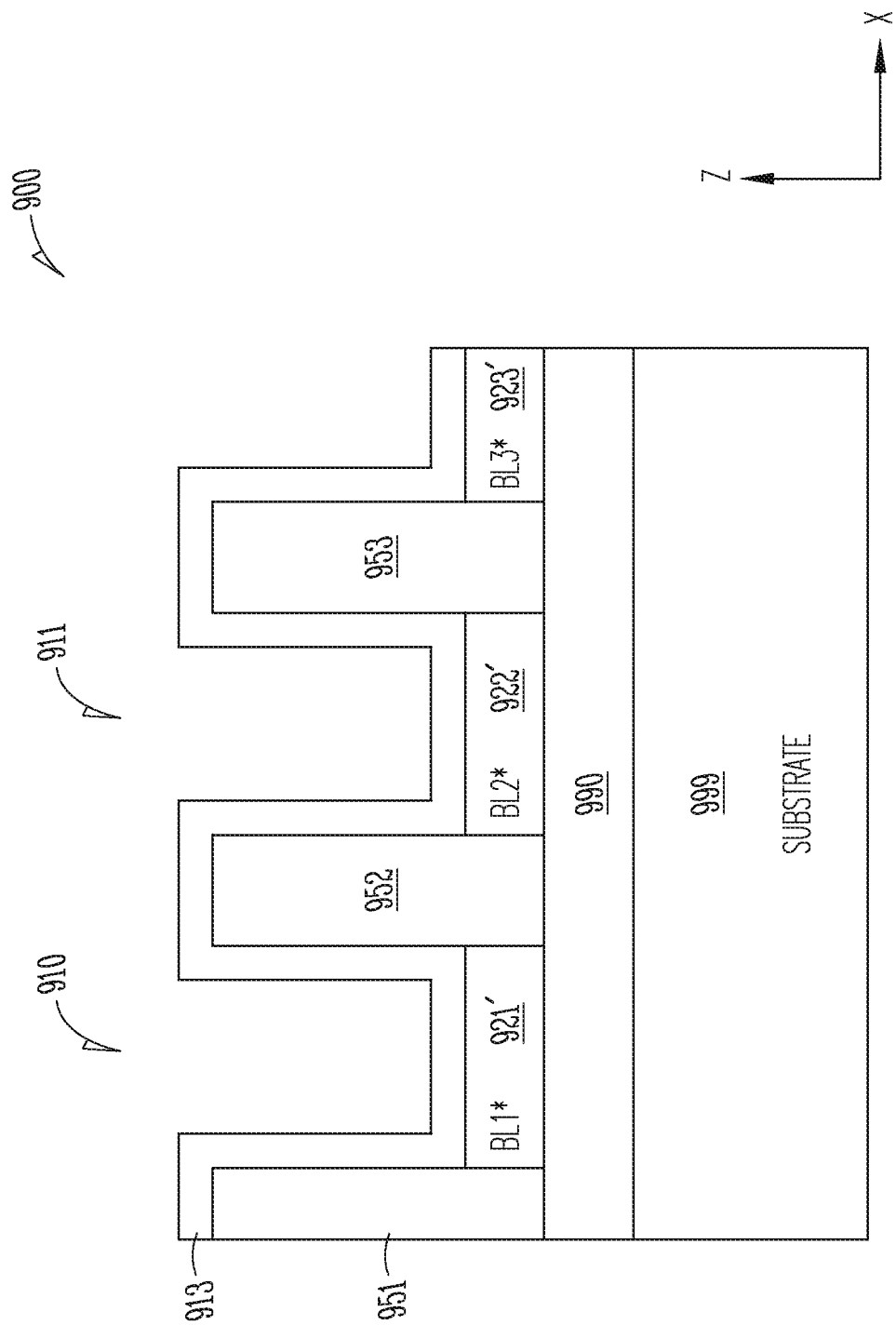
Figure 9F:
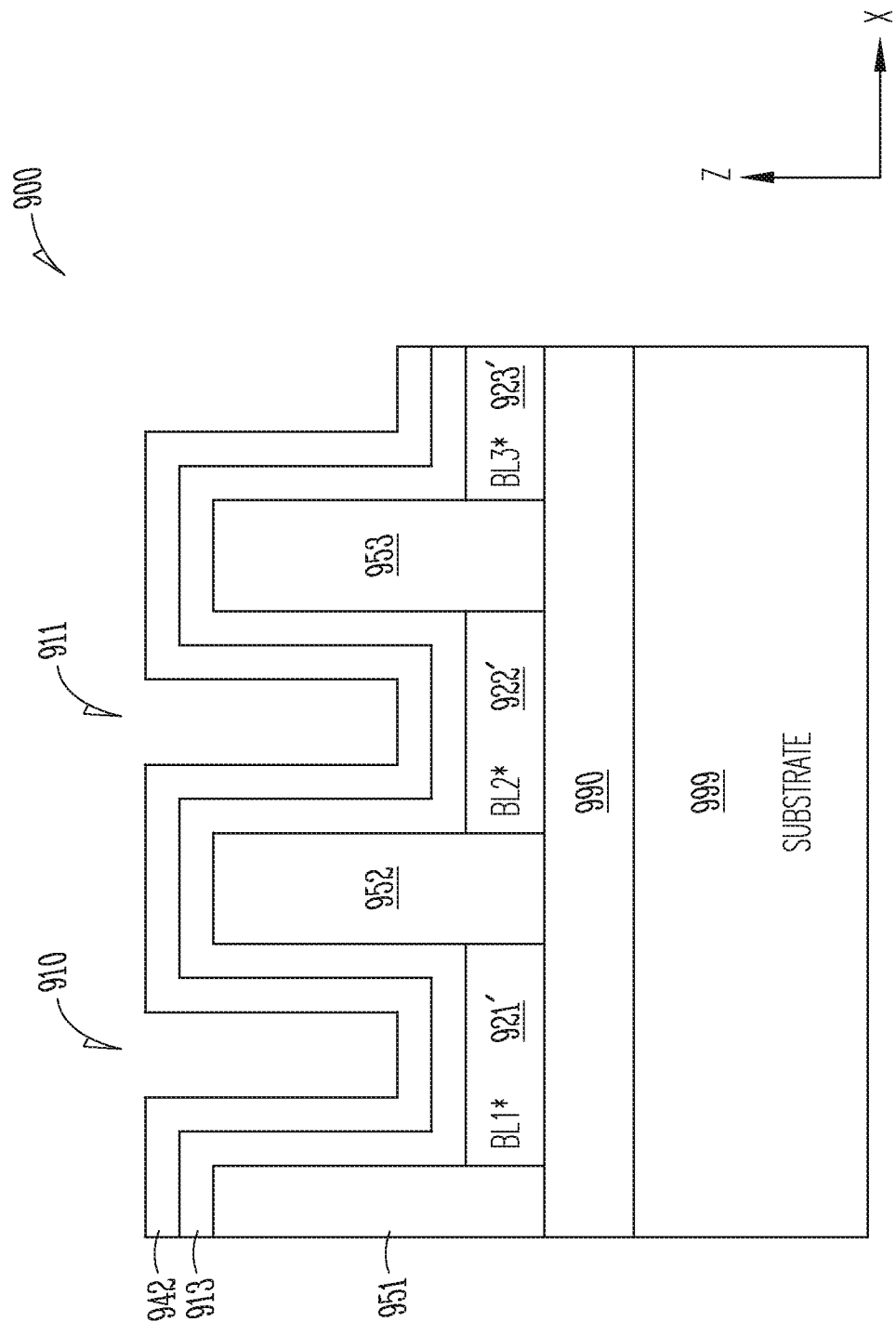
Figure 9C:
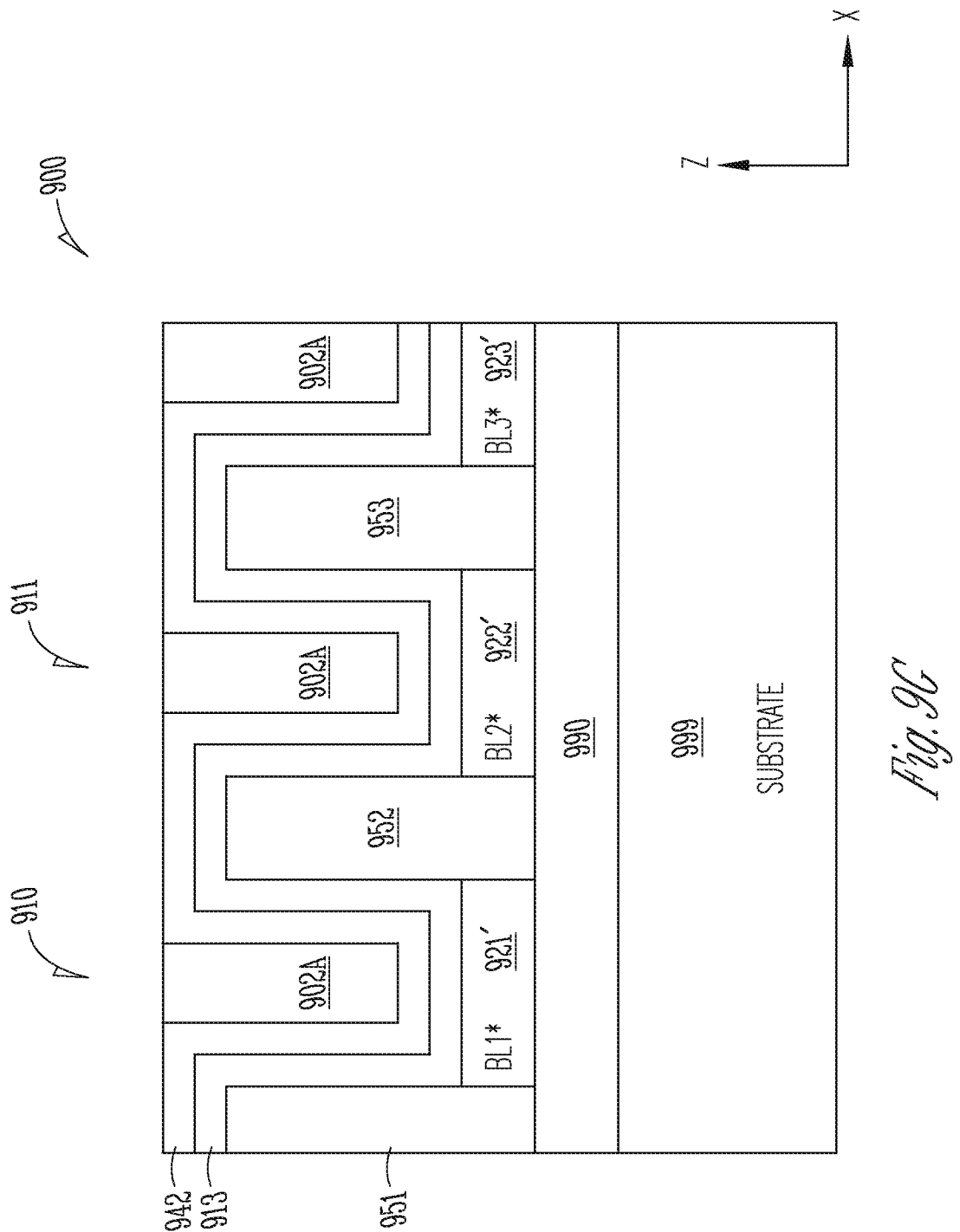
Figure 9H:
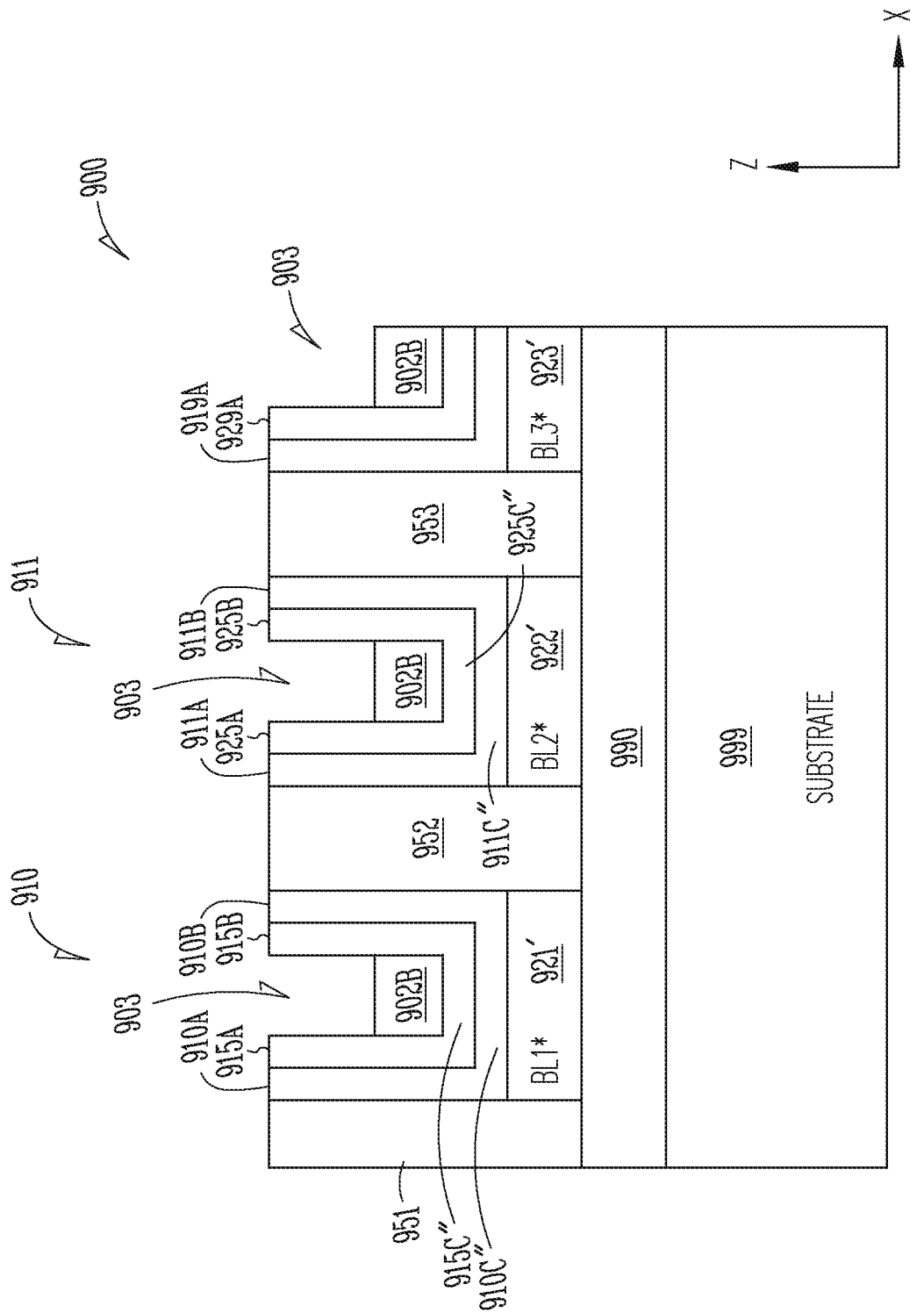
Figure 9I:
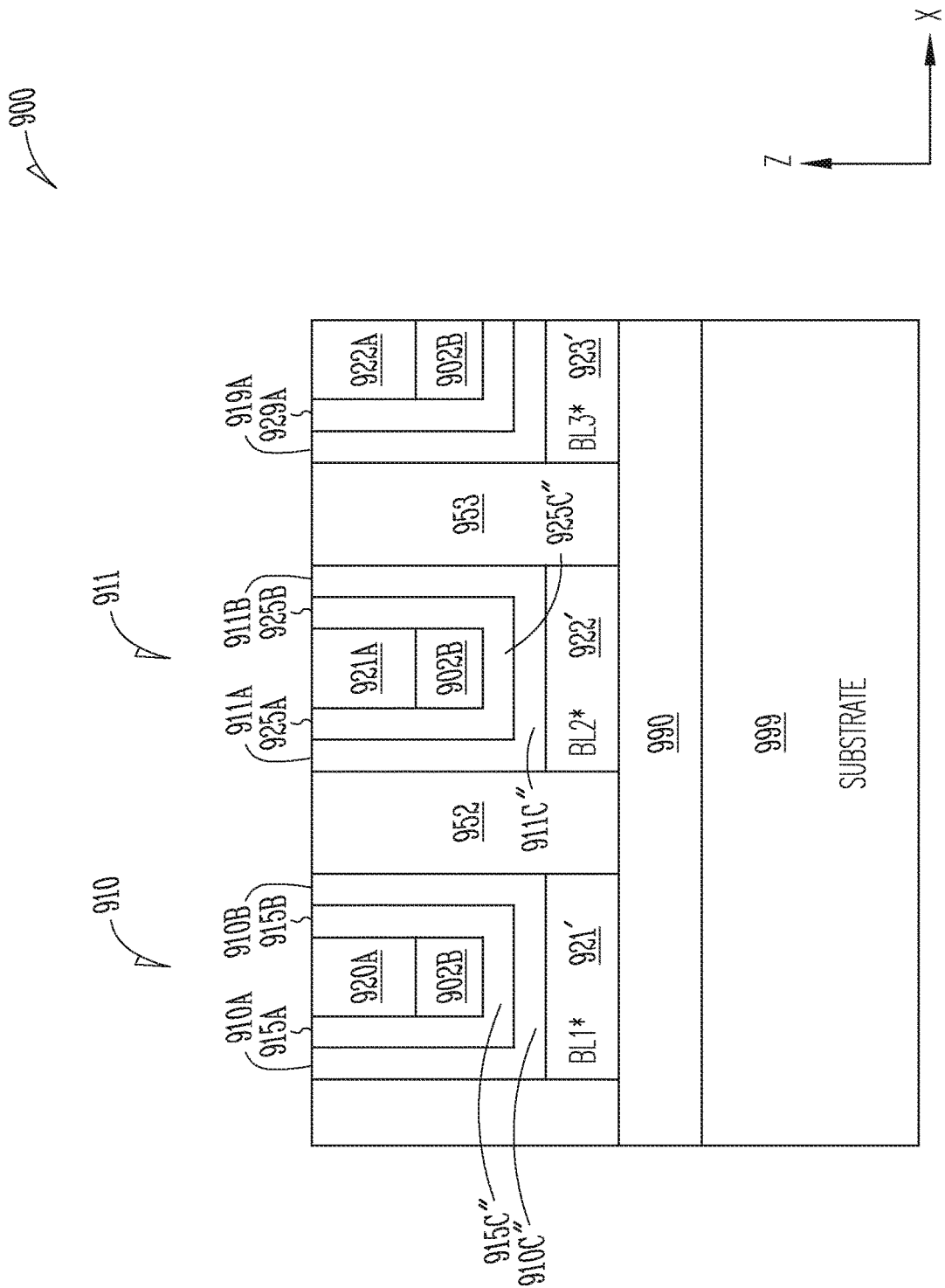
Figure 9J:
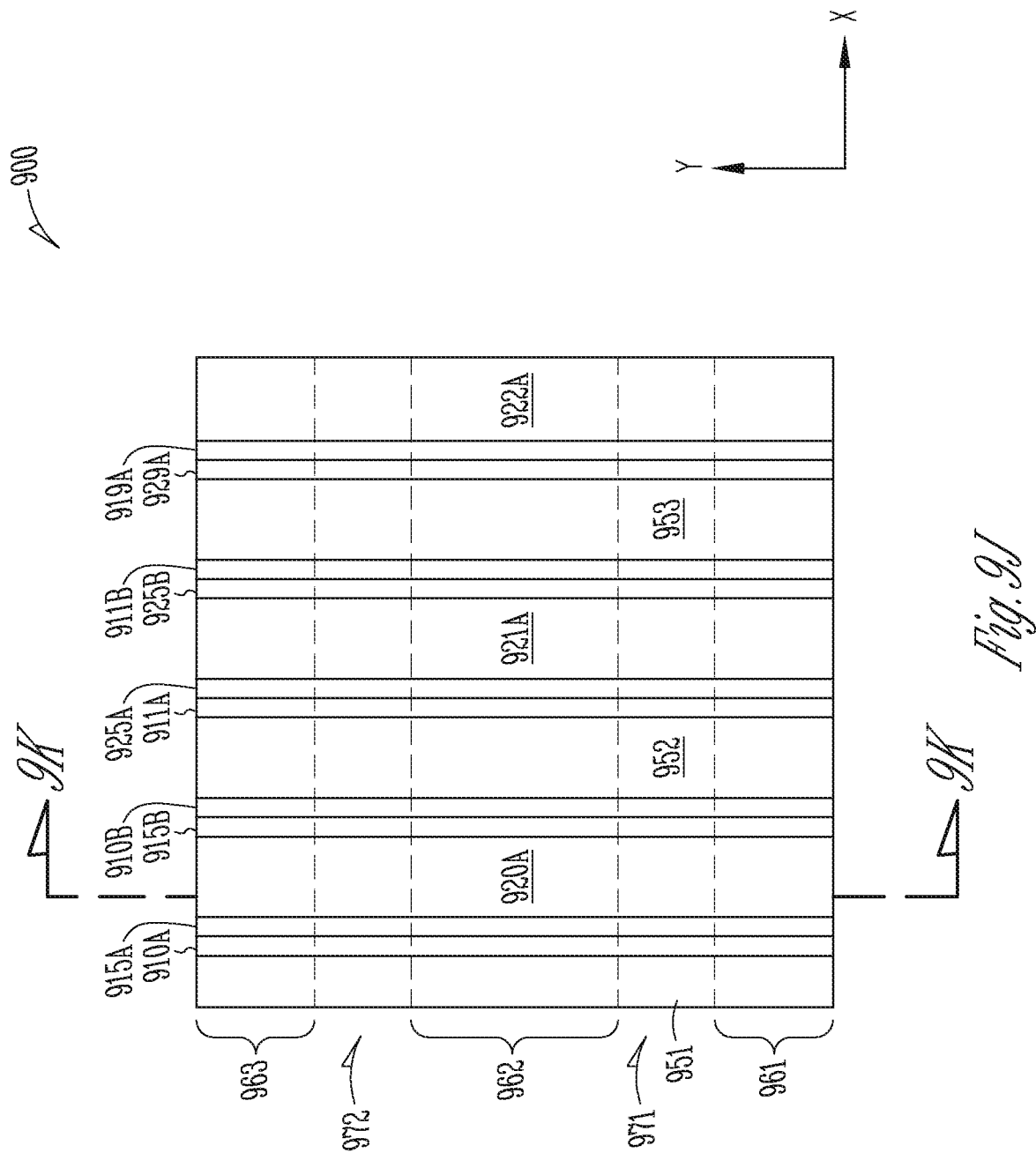
Figure 9K:
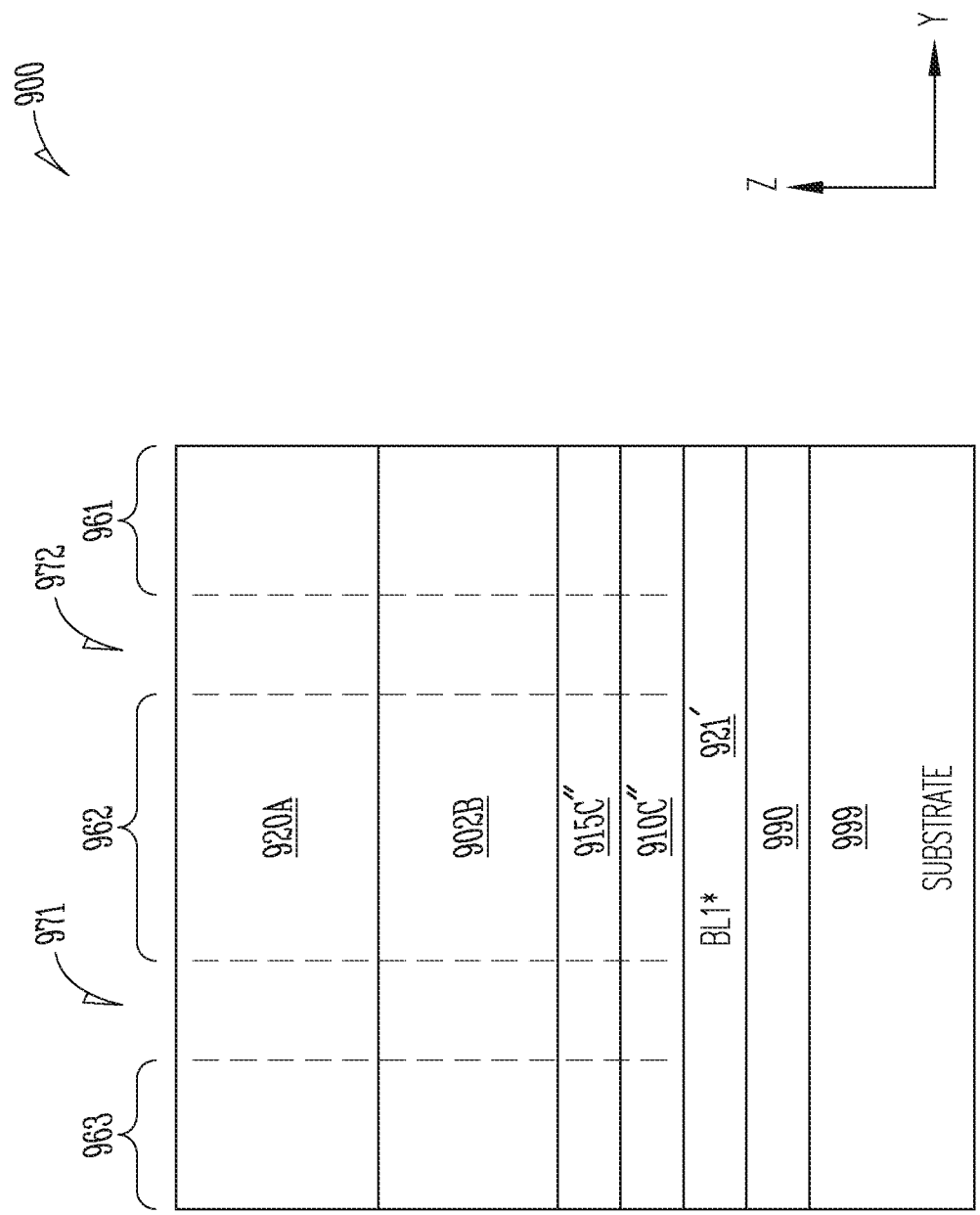
Figure 9M:
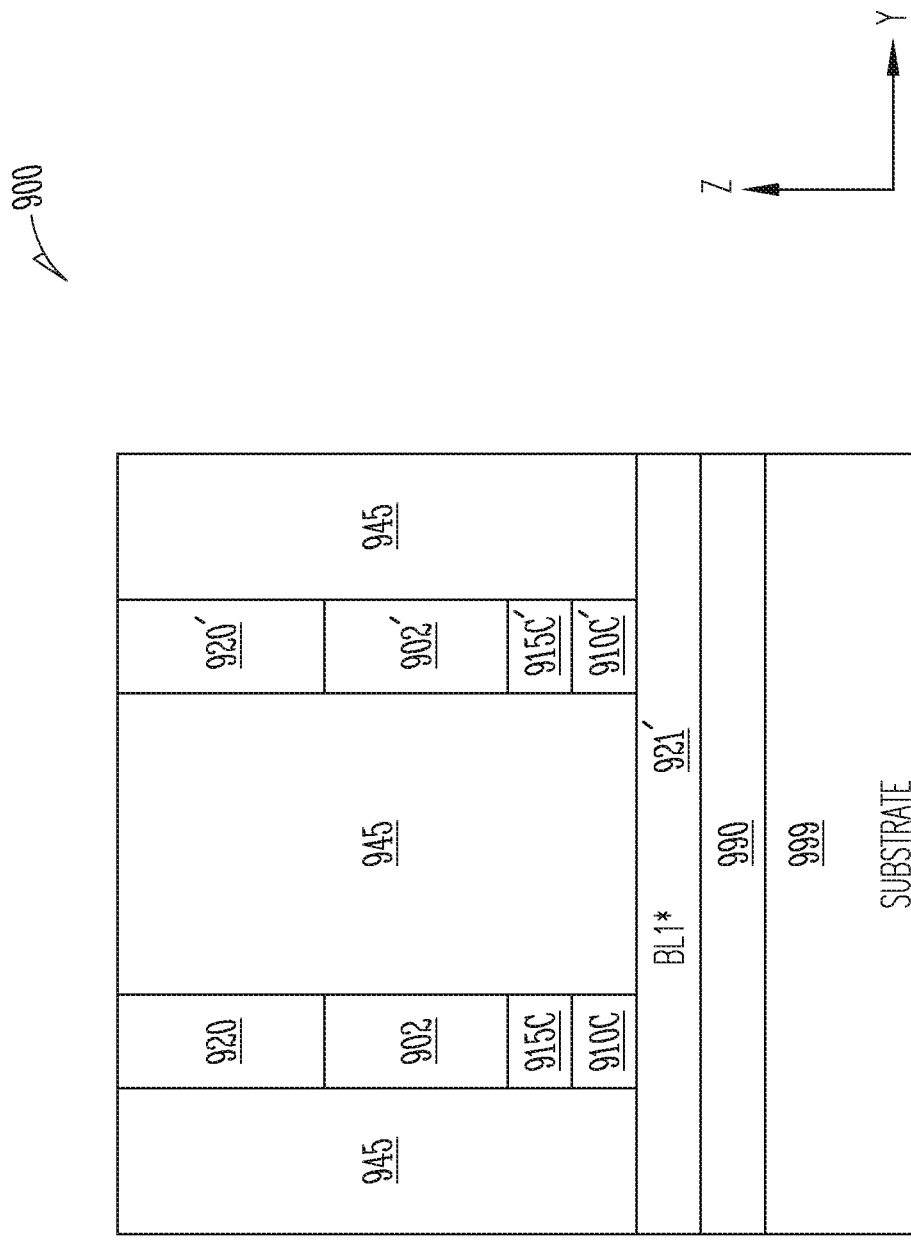
Figure 9N:
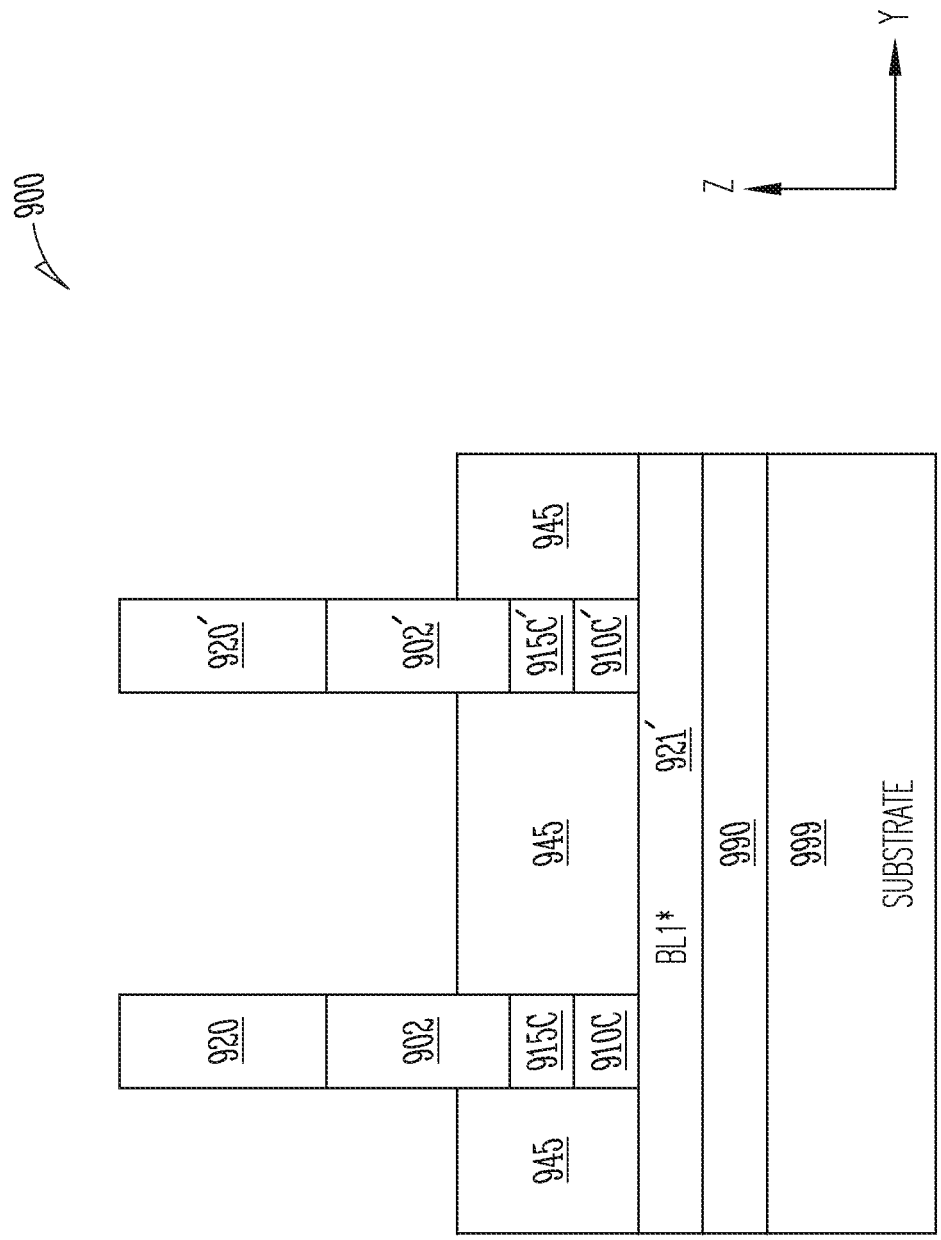
Figure 90:
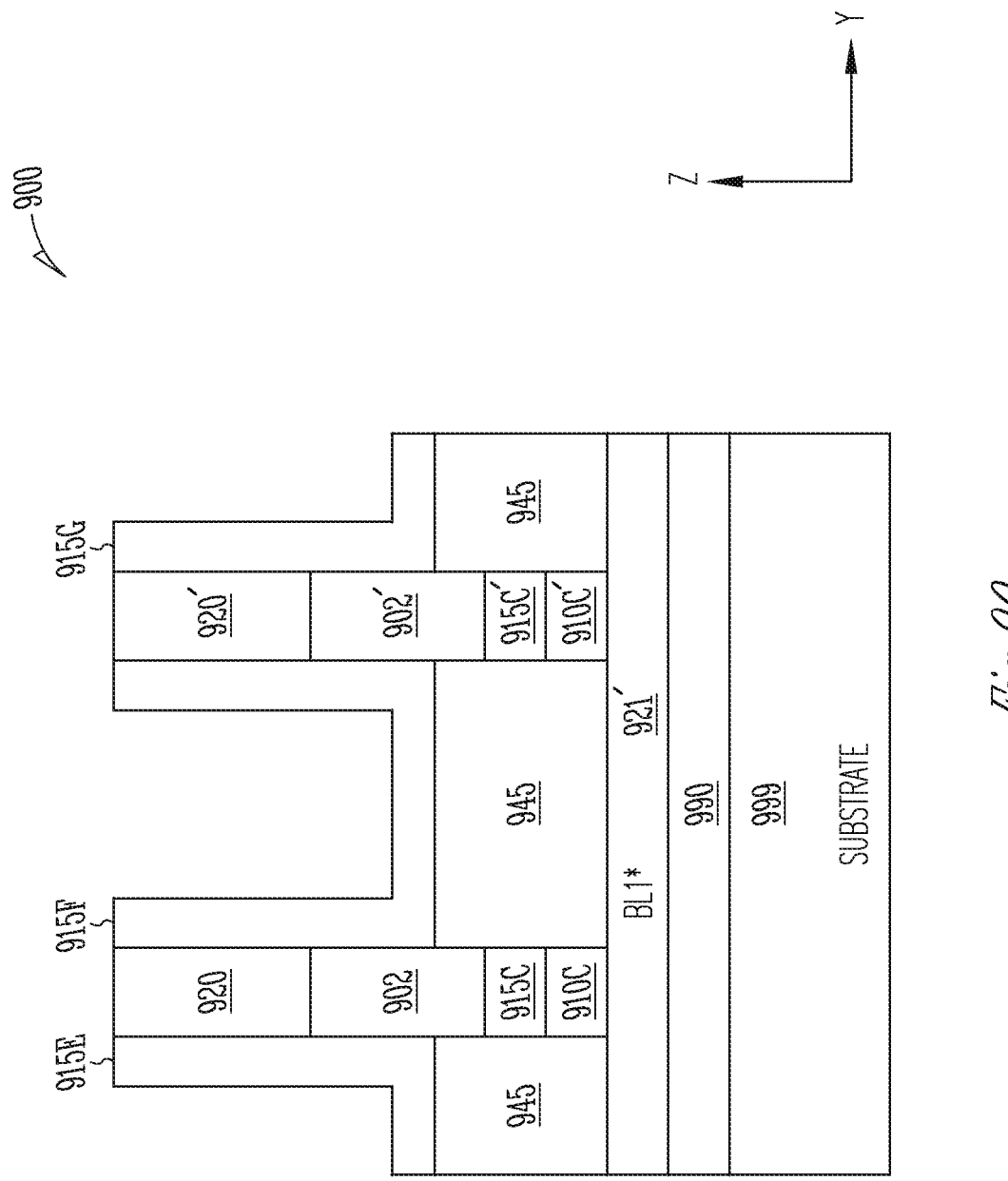
Figure 9P:
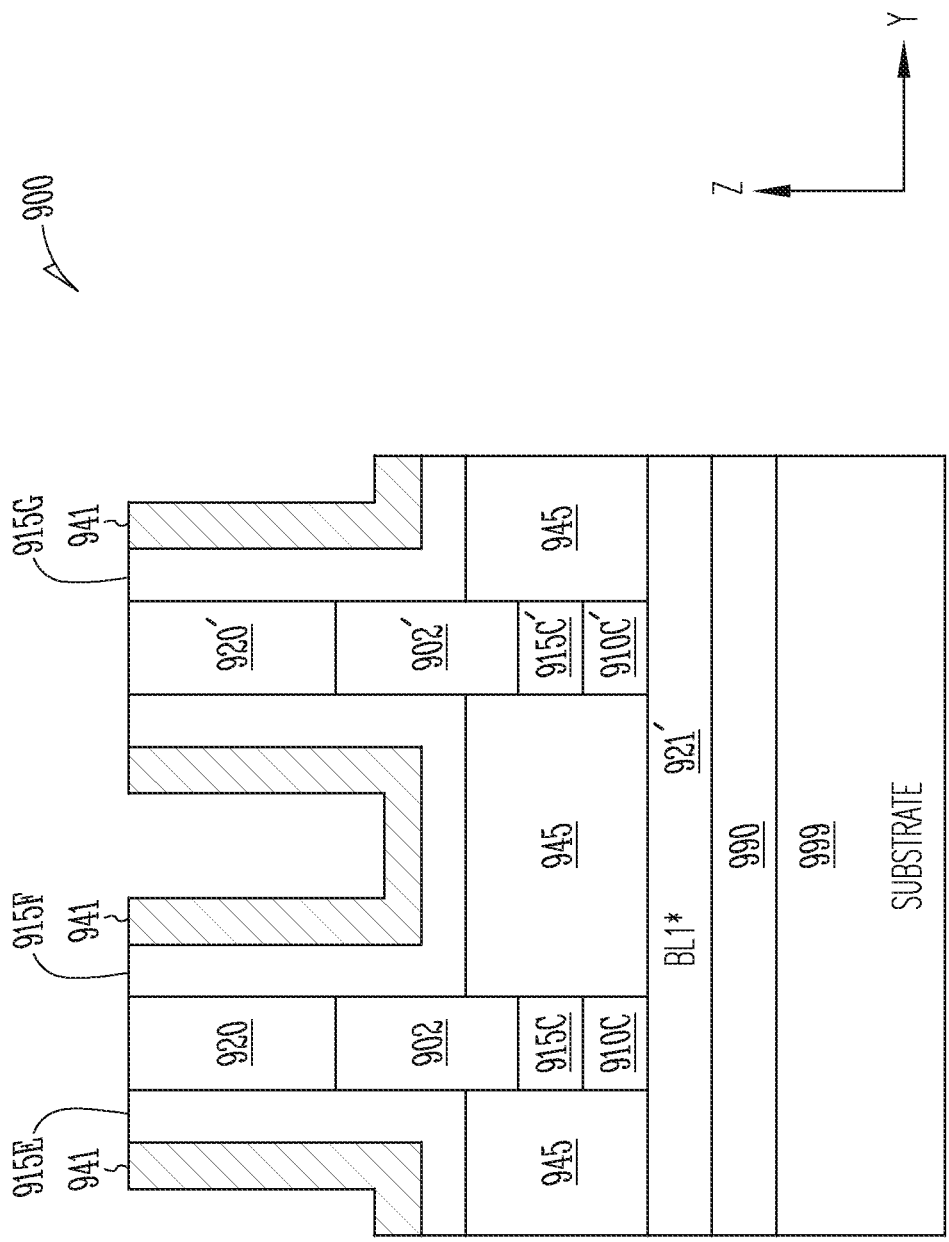
Figure 9Q:
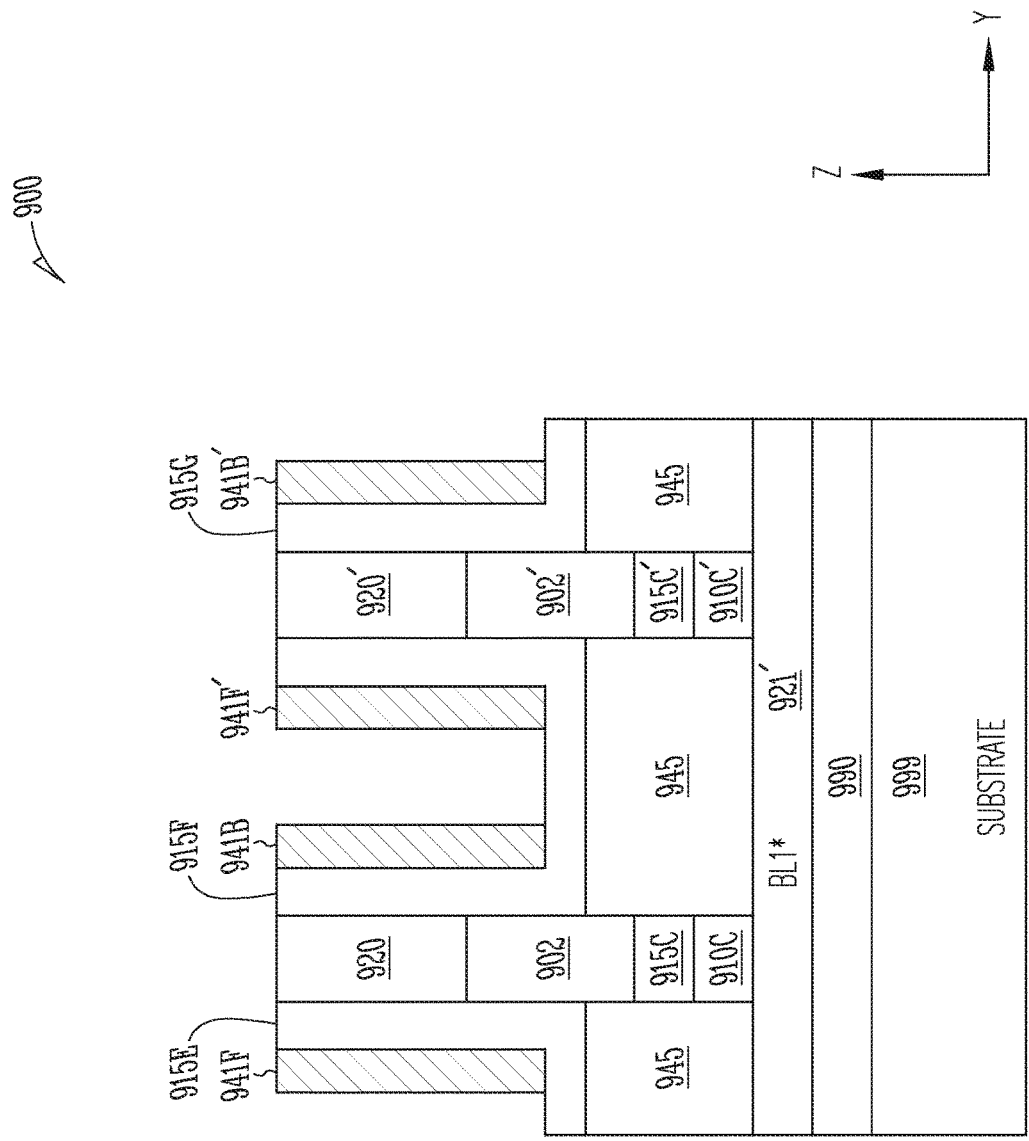
Figure 9R:
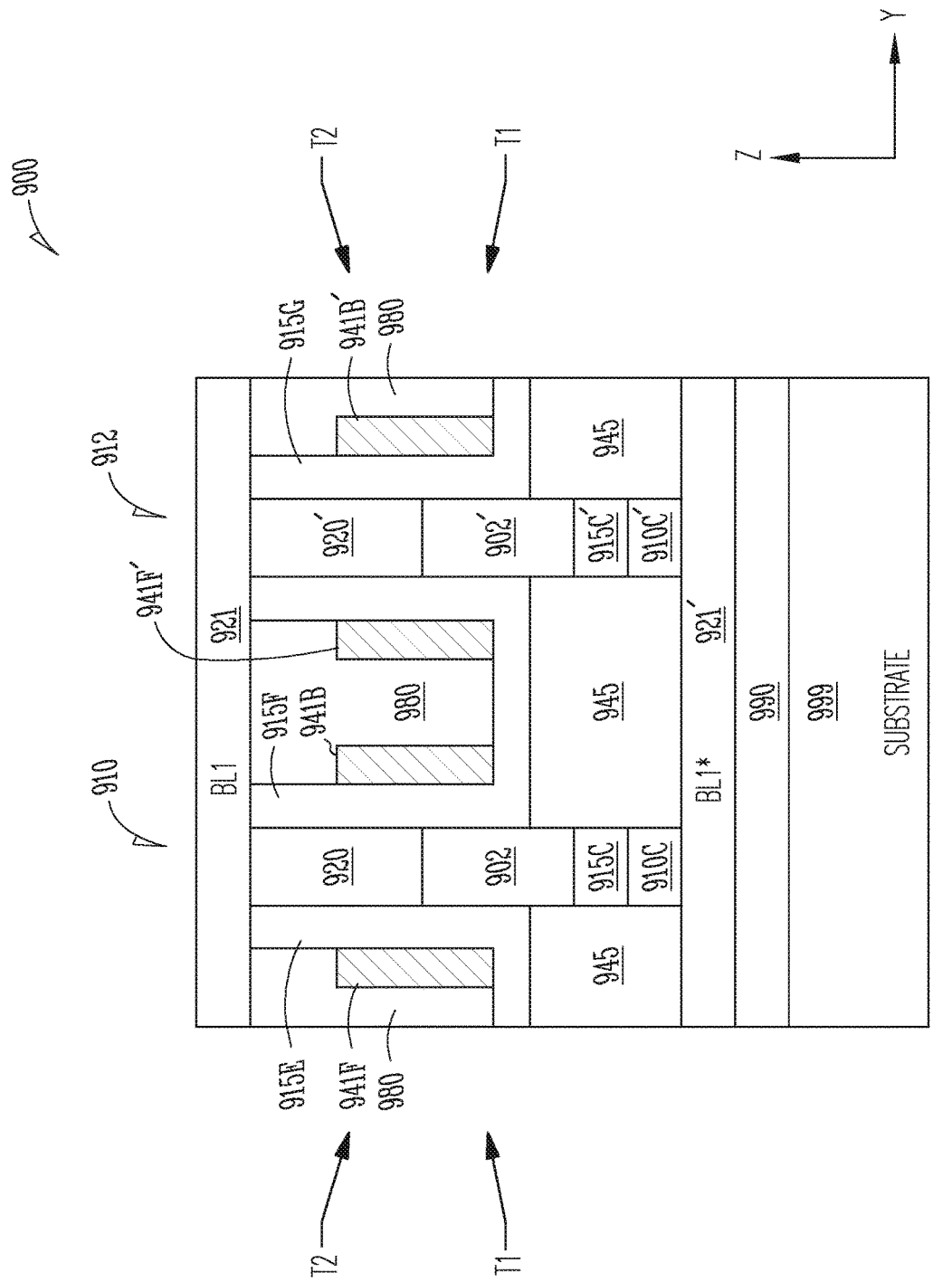

FIG. 9A through FIG. 9R show cross-sectional views of elements during processes of forming a memory device 900, according to some embodiments of the invention. Some or all of the processes used to form memory device 900 can be used to form memory device 200 described above with reference to FIG. 2 through FIG. 8.

FIG. 9A shows memory device 900 after a dielectric material 990, a conductive material 927, and a material 930 are formed in respective levels (e.g., layers) in the Z-direction over a substrate 999. The Z-direction (e.g., vertical direction) is a direction perpendicular to (e.g., outward from) substrate 999. The Z-direction is also perpendicular to the X-direction. Dielectric material 990, conductive material 927, and material 930 can be formed in a sequential fashion one material after another over substrate 999. For example, the processes used in FIG. 9A can include forming (e.g., depositing) dielectric material 990 over substrate, forming (e.g., depositing) conductive material 927 over dielectric material 990, and forming (e.g., depositing) material 930 over conductive material 927.

Substrate 999 can be similar to or identical to substrate 599 of FIG. 5. Dielectric materials 922 of FIG. 9A can include an oxide material (e.g., silicon dioxide $SiO_2$). Conductive material 927 can include metal, conductively doped polysilicon, or other conductive materials. As described below in subsequent processes of forming memory device 900, conductive material 927 can be structured to form data lines of memory device 900 that can be similar to data line 221' and 222' of memory device 200 (FIG. 5). Material 930 can be a "sacrificial" material, which can be removed (in subsequent processes) at some points during the processes of forming memory device 900. Material 930 can include a nitride material (e.g., silicon nitrite $SiN_4$) or other material that can be relatively easy to remove (e.g., etch away).

FIG. 9B shows memory device 900 after openings (e.g., trenches) 931, 932, and 933 and data lines 921', 922', and 923' are formed. FIG. 9B also shows signals (e.g., bit line signals) BL1*, BL2*, and BL3* that can represent signals applied to data lines 921', 922', and 923', respectively, during an operation (e.g., read or write) of memory device 900. Signals BL1* and BL2* can be similar to signals BL1* and BL2* of memory device 500 in FIG. 5.

In FIG. 9B, forming openings 931, 932, and 933 can include removing (e.g., by patterning) part of material 930 at the locations of openings 931, 932, and 933 and leaving portions 930A, 930B, and 930C (which are remaining portions of material 930) as shown in FIG. 9B. Forming data lines 921', 922', and 923' can include removing part of conductive material 923 (at the location of openings 931, 932, and 933) leaving remaining portions of conductive material 923 that form respective data lines 921', 922', and 923'. As shown in FIG. 9B, data lines 921', 922', and 923' are electrically separated (in the X-direction) from each other. Data lines 921' and 922' can be similar to data lines 221' and 222' (e.g., bottom data lines) of memory device 200 shown in FIG. 5. Data line 923' can be another data line of memory device 900.

FIG. 9C shows memory device 900 after dielectric materials 951, 952, and 953 are formed filled) in openings 931, 932, and 933, respectively. The processes in FIG. 9C can include a flattening process (e.g., chemical mechanical polishing (CMP) process) after dielectric materials 951, 952, and 953 are formed. Such a flattening process can smooth (e.g., planarize) the top surface of the structure of memory device 900 shown in FIG. 9C.

FIG. 9D shows memory device 900 after portions 930A, 930B, and 930C (FIG. 9C) are removed. The processes in FIG. 9D can include an etch process to remove portions 930A, 930B, and 930C from the structure of memory device 900 of FIG. 9D.

FIG. 9E shows memory device 900 after a material 913 (e.g., transistor channel material) is formed (e.g., deposited) over data lines 921', 922', and 923' and over dielectric materials 951, 952, and 953. Material 913 can conduct a current during an operation (e.g., a read operation) of memory device 900. An example of material 913 includes a semiconductor material. Material 913 can have the same properties of the material that form portions 510A, 510B, and 5100 (e.g., read channel regions) of respective transistor T1 of memory device 500 of FIG. 5. As described below in subsequent processes (e.g., FIG. 9L) of forming memory device 900, material 913 can be structured to form a channel region (e.g., read channel region) of a transistor (e.g., transistor T1) of a respective memory cell of memory device 900.

FIG. 9F shows memory device 900 after a dielectric material (e.g., gate oxide material) 942 is formed (e.g., deposited) over material 913. Dielectric material 942 can include silicon dioxide. As described below in subsequent processes (e.g., FIG. 9H) of forming memory device 900, material 942 of FIG. 9F can be structured to form part of a gate oxide of transistors (e.g., transistors T1 and T2) of a respective memory cell of memory device 900.

FIG. 9G shows memory device 900 after a material (e.g., charge storage material) 902A is formed (e.g., filled) in open spaces between portions of dielectric material 942. As described below in subsequent processes (FIG. 9L) of forming memory device 900, material 902A can be structured to form a charge storage structure of a respective memory cell of memory device 900. Material 902A can include material (e.g., polysilicon) similar to or identical the material of charge storage structure 202 the memory cells (e.g., memory cell 210 or 211) of memory device 500 (FIG. 5).

FIG. 9H shows memory device 900 after part of each of materials 913, 942, 902A, 952, and 953 in FIG. 9G is removed. The processes in FIG. 9H can include a process (e.g., CMP process) that can remove part of material 913 to form portions (remaining part of material 913) 910A, 910B, and 910C", 911A, 911B, 910C", and 919A. The combination of portions 910A, 910B, and 910C" can form a channel region of a transistor (e.g., transistor T1) of memory cell 910 in subsequent processes. The combination of portions 911A, 911B, and 910C" can form a channel region of a transistor (e.g., transistor T1) of memory cell 911. Portion 919A can form part of a channel region of a transistor of a memory cell next to memory cell 911.

The process (e.g., CMP process) in FIG. 9H can also remove part of material 942 to form portions (remaining part of material 942) 915A, 915B, 915C", 925A, 925B, 925C", and 929A. The combination of portions 915A, 915B, and 915C" can form part of gate oxide regions of transistors (e.g., transistors T1 and T2) of memory cell 910 in subsequent processes. The combination of portions 925A, 925B, and 925C" can form part of gate oxide regions of transistors (e.g., transistors T1 and T2) of memory cell 911 in subsequent processes. Portion 929A can form part of gate oxide regions of transistors of a memory cell next to memory cell 911.

The processes in FIG. 9H can also include a process (e.g., an etch process performed after a CMP process) that can remove part of material 902A (FIG. G) to form recesses (e.g., openings) 903 and portions (e.g., channel regions) 902B exposed at respective recesses 903. Portion 902B are the remaining part of material 902A.

FIG. 9I shows memory device 900 after materials 920A, 921A, and 922A are formed (e.g., deposited) in respective recesses 903. Materials 920A, 921A, and 922A can include materials similar to or identical the materials of portion (e.g., write channel region) 520 or 521 (FIG. 5) of transistor T2 of memory device 500 of FIG. 5. As described below in subsequent processes (FIG. 9L) of forming memory device 900, material 920A can form a channel region (e.g., write channel region) of a transistor (e.g., transistor T2) of a respective memory cell of memory device 900.

As shown in FIG. 9I, part of the elements of memory device 900 can form part of memory cells 910 and 911, which can be similar to memory cells 210 and 211 (FIG. 5), respectively, of memory device 500.

FIG. 9J shows a top view with respect to the X-Y directions of memory device 900 of FIG. 9I. For simplicity, the description of the elements shown in FIG. 9J (which are described with reference to FIG. 9I) is not repeated. As shown in FIG. 9J, the elements of memory device 900 can include strips of materials having lengths extending in the Y-direction. In subsequent processes of forming memory device 900, the materials at locations 961, 962, and 963 of memory device 900 will be removed (e.g., cut (e.g., etch to form trench) in the Z-direction) and the materials of memory device 900 at locations 971 and 972 will remain (and will be parts of respective memory cells of memory device 900). Another view of memory device 900 along line 9K-9K is shown in FIG. 9K.

FIG. 9K shows a side view, along line 9K-9K of FIG. 9J with respect to the Y-Z directions, of memory device 900 of FIG. 9J. In FIG. 9K also shows locations 961, 962, 963, 971 and 972 of memory device 900 relative to the Y-Z directions. The structure (e.g., materials 920A, 902B, 915C", and 910C") of memory device 900 at locations 961, 962, and 963 will be removed (FIG. 9L) and stopped at data line 921', such that the material of data line 921' at locations 961, 962, and 963 is not removed.

FIG. 9L shows memory device 900 after openings (e.g., trenches) 961A, 962A, and 963A and portions 920, 920', 902', 915C, 915C', 910C, and 910C' are formed. Openings 961A, 962A, and 963A can be formed by removing part of each of materials 920A, 902B, 915C", and 910C" at locations 961, 962, and 963 (as mentioned above). In FIG. 9L, portions 920, 920', 902, 902', 915C, 915C', 910C, and 910C' are remaining parts of respective materials 920A, 902B, 915C", and 910C" of FIG. 9K.

FIG. 9M shows memory device 900 after dielectric material 945 is formed. Dielectric material 945 can include silicon dioxide.

FIG. 9N shows memory device 900 after part of dielectric material 945 in FIG. 9M is removed. The remaining part of dielectric material 945 is shown in FIG. 9N.

FIG. 9O shows memory device 900 after dielectric portions 915E, 915F, and 915G are formed. Dielectric portions 915E, 915F, and 915G can include silicon dioxide.

FIG. 9P shows memory device 900 after a conductive material 941 is formed. Conductive material 941 can include metal, conductively doped polysilicon, or other conductive materials. In subsequent processes of forming memory device 900, conductive material 941 can be structured to form access lines (e.g., word lines) of memory device 900.

FIG. 9Q shows memory device 900 after portions 941F, 941B, 941F', and 941B' are formed. Forming portions 941F, 941B, 941F', and 941B' can include removing part (e.g., bottom part) of conductive material 941 (FIG. 9P) leaving part of conductive material 941 as portions 941F, 941B, 941F', and 941B' shown in FIG. 9Q. Removing part of conductive material 941 can include a punch etch process to electrically separate portions of conductive material 941 from each other in the Y-direction. For example, portion 941B is electrically separated from portion 941F'. Portion 941F is also electrically separated from another portion (not shown) of conductive material 941 in the Y-direction. Portion 941B' is also electrically separated from another portion (not shown) of conductive material 941 in the Y-direction.

FIG. 9R shows memory device 900 after a dielectric material 980 and a data line 921 are formed. FIG. 9R also a shows signal (e.g., bit line signal) BL1 that can represent a signal applied to data line 921 during an operation (e.g., read or write) of memory device 900. Signal BL1 can be similar to signal BL1 of memory device 500 in FIG. 5. In FIG. 9R, dielectric material 980 can include silicon dioxide. Data line 921 can be formed after dielectric material 980 is formed and can be formed from conductive material (e.g., metal, conductively doped polysilicon, or other conductive materials).

As shown in FIG. 9R, data line 921 can be formed such that it is electrically coupled to portions 920 and 920' and electrically separated from portions 941F, 941B, 941F', and 941B'. For example, the processes in FIG. 9R can include removing part (e.g., top part) of each of portions 941F, 941B, 941F', and 941B' before data line 921 is formed, so that data line 921 is electrically separated from portions 941F, 941B, 941F', and 941B' when data line 921 is formed.

As shown in FIG. 9R, part of memory device 900 can form memory cells 910 and 912, which can be similar to memory cells 210 and 212 of memory device 200 (schematically shown in FIG. 2), respectively. In FIG. 9R, portions 941F and 941B can be part of an access line (e.g., word line and associated signal WL1) that can used to control transistors T1 and T2 of memory cell 910 during a memory operation (e.g., read or write operation) of memory device 900. Portions 941F' and 941B' can be part of an access line (e.g., word line and associated signal WL2) that can used to control transistors T1 and T2 of memory cell 912 during a memory operation (e.g., read or write operation) of memory device 900. FIG. 9Q does not show memory cell 911 (FIG. 9I) of memory device 900. However, memory cell 911 can be located in the X-direction (e.g., located behind the view of memory cell 910 in FIG. 9R) and can share the same access line that includes portions 941F and 941B.

In FIG. 9R, portion 920 can form a channel portion (e.g., write channel portion) of transistor T2 of memory cell 910, portion 902 can form a charge storage structure (e.g., floating gate of transistor T1) of memory cell 910, portion 915C can form part of a gate oxide of transistors T1 and T2 of memory cell 910, and portion 910C can form part of a channel portion (e.g., read channel portion) of transistor T1 of memory cell 910. Portion 920' can form a channel portion (e.g., write channel portion) of transistor T2 of memory cell 912, portion 902' can form a charge storage structure (e.g., floating gate of transistor T1) of memory cell 912, portion 915C' can form part of a gate oxide of transistors T1 and T2 of memory cell 912, and portion 910C can form part of a channel portion (e.g., read channel portion) of transistor T1 of memory cell 910.

FIG. 10A through FIG. 10E show cross-sectional views of elements during processes of forming a memory device 1000, according to some embodiments of the invention. Some or all of the processes used to form memory device 1000 can be used to form memory device 200 described above with reference to FIG. 2 through FIG. 8. The processes of forming memory device 1000 can be a variation of the processes of forming memory device 900 (FIG. 9A through FIG. 9R). Thus, similar elements (which have the same labels) between the processes of forming memory devices 900 and 1000 are not repeated.

Figure 10A:
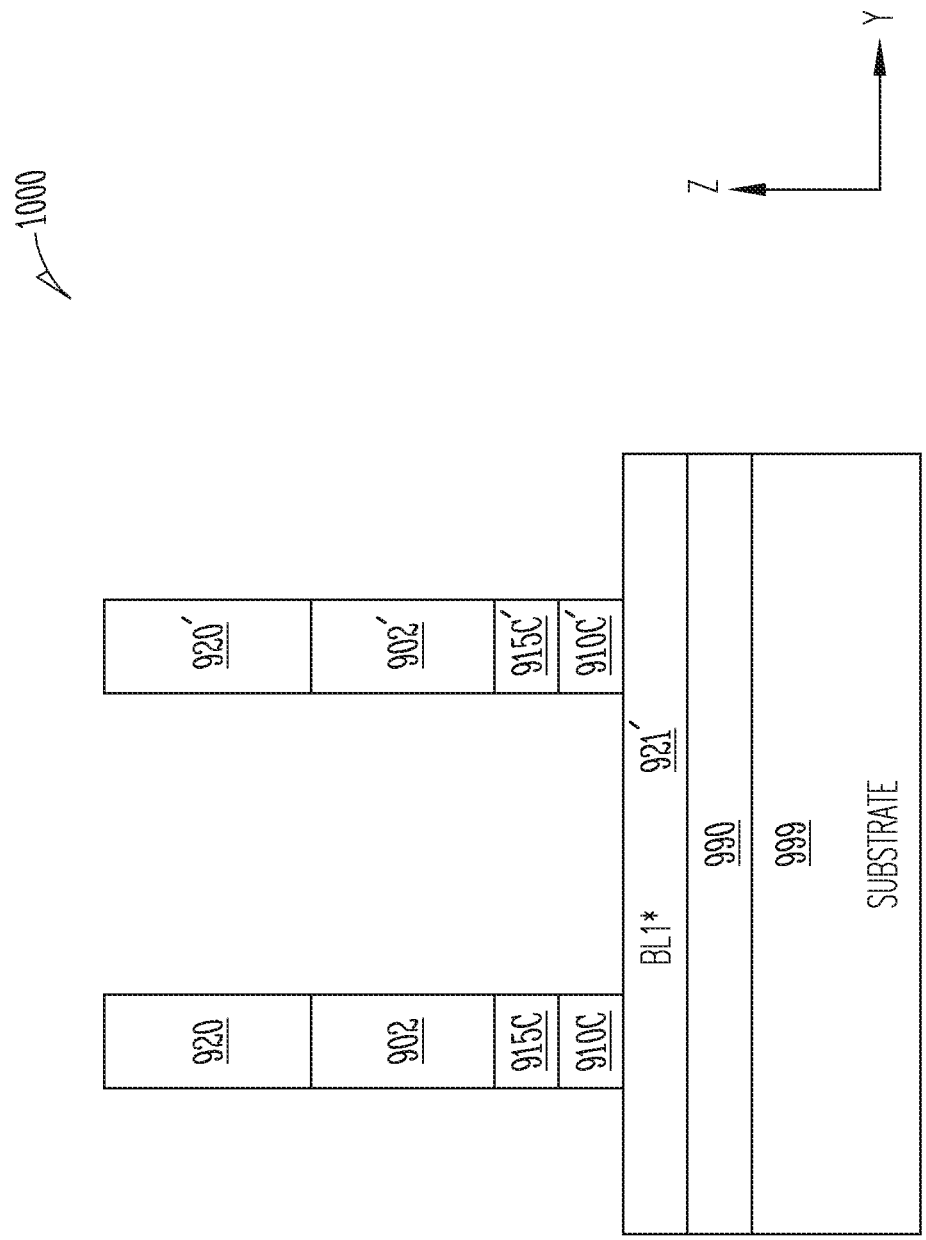

FIG. 10A shows the elements of memory device 1000 that can be formed using similar or identical processes used to the elements of memory device 900 from FIG. 9A through FIG. 9L. Thus, the elements of memory device 1000 shown in FIG. 10A can be similar to the elements of memory device 900 shown in FIG. 9L.

Figure 10B:
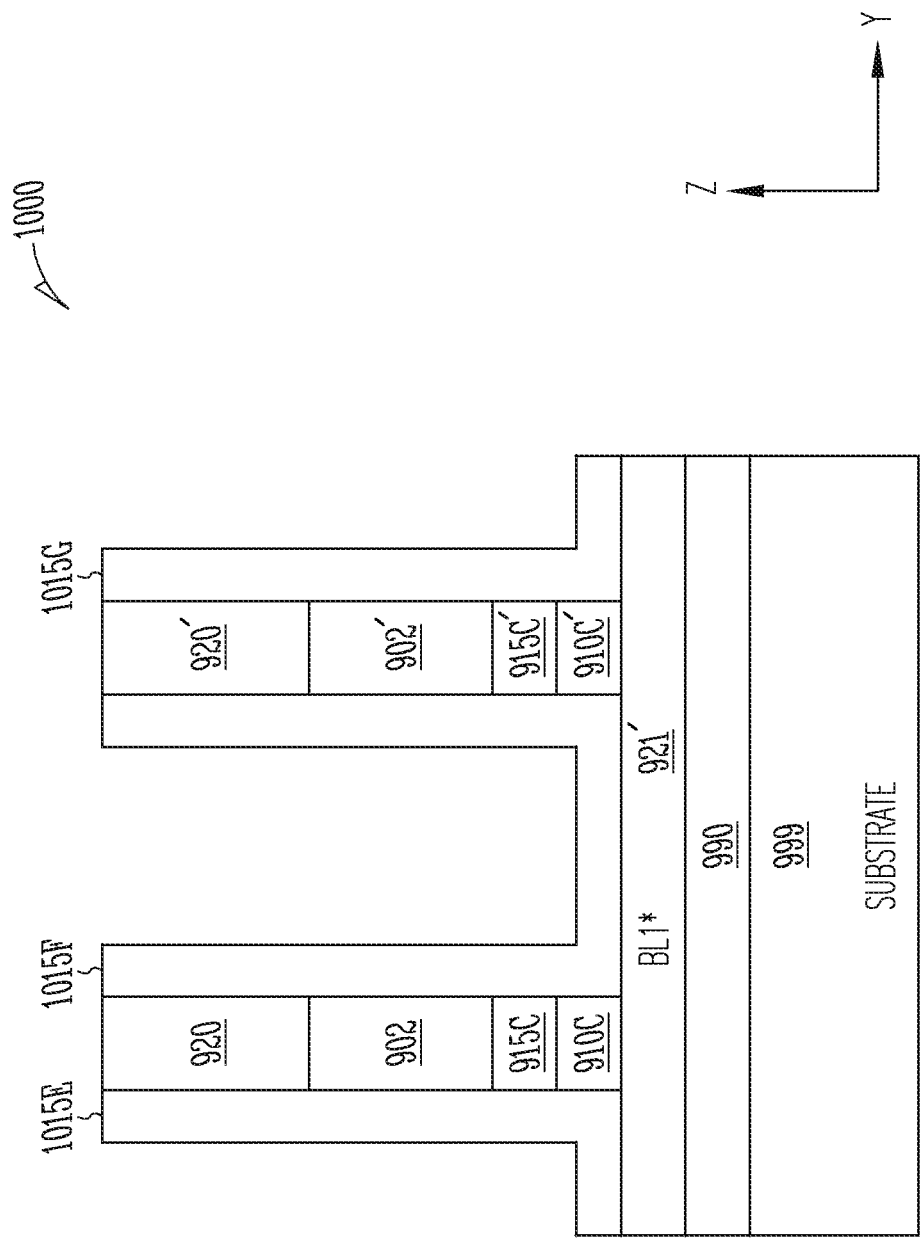

FIG. 10B shows memory device 900 after dielectric portions 1015E, 1015F, and 1015G are formed. Dielectric portions 1015E, 1015F, and 1015G can include silicon dioxide.

Figure 10C:
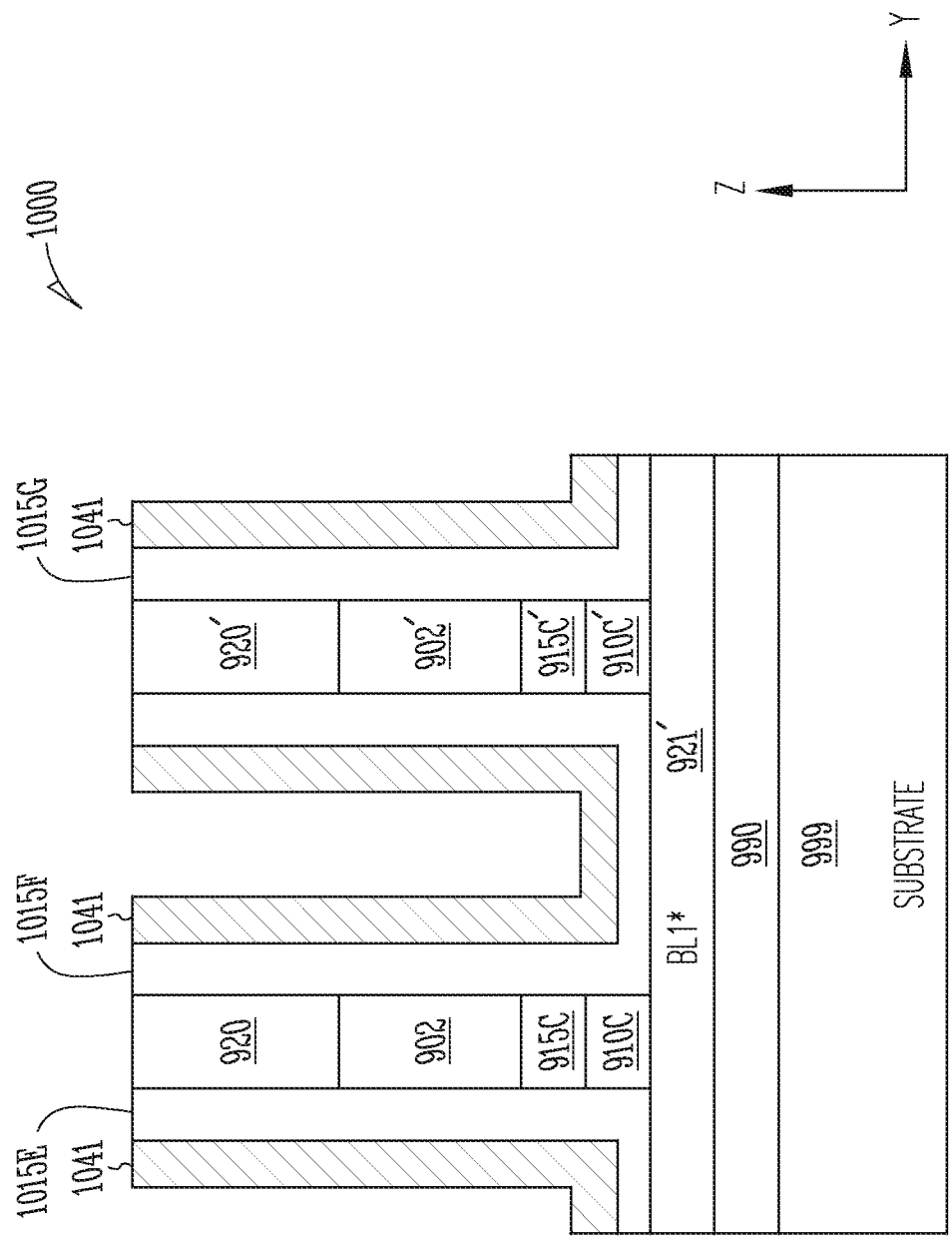

FIG. 10C shows memory device 900 after a conductive material 1041 is formed. Conductive material 941 can include metal, conductively doped polysilicon, or other conductive materials. In subsequent processes of forming memory device 900, conductive material 1041 can be structured to form access lines (e.g., word lines) of memory device 1000.

FIG. 10D shows memory device 1000 after portions 1041F, 1041B, 1041F', and 1041B' are formed. Forming portions 1041F, 1041B, 1041F', and 1041B' can include removing part (e.g., bottom part) of conductive material 1041 (FIG. 10E) leaving part of conductive material 1041 as portions 1041F, 1041B, 1041F', and 1041B' shown in FIG. 10D. Removing part of conductive material 1041 can include a punch etch process to electrically separate portions of conductive material 1041 from each other in the Y-direction. For example, portion 1041B is electrically separated from portion 1041F'. Portion 1041F is also electrically separated from another portion (not shown) of conductive material 1041 in the Y-direction. Portion 1041B' is also electrically separated from another portion (not shown) of conductive material 1041 in the Y-direction.

Figure 10E:
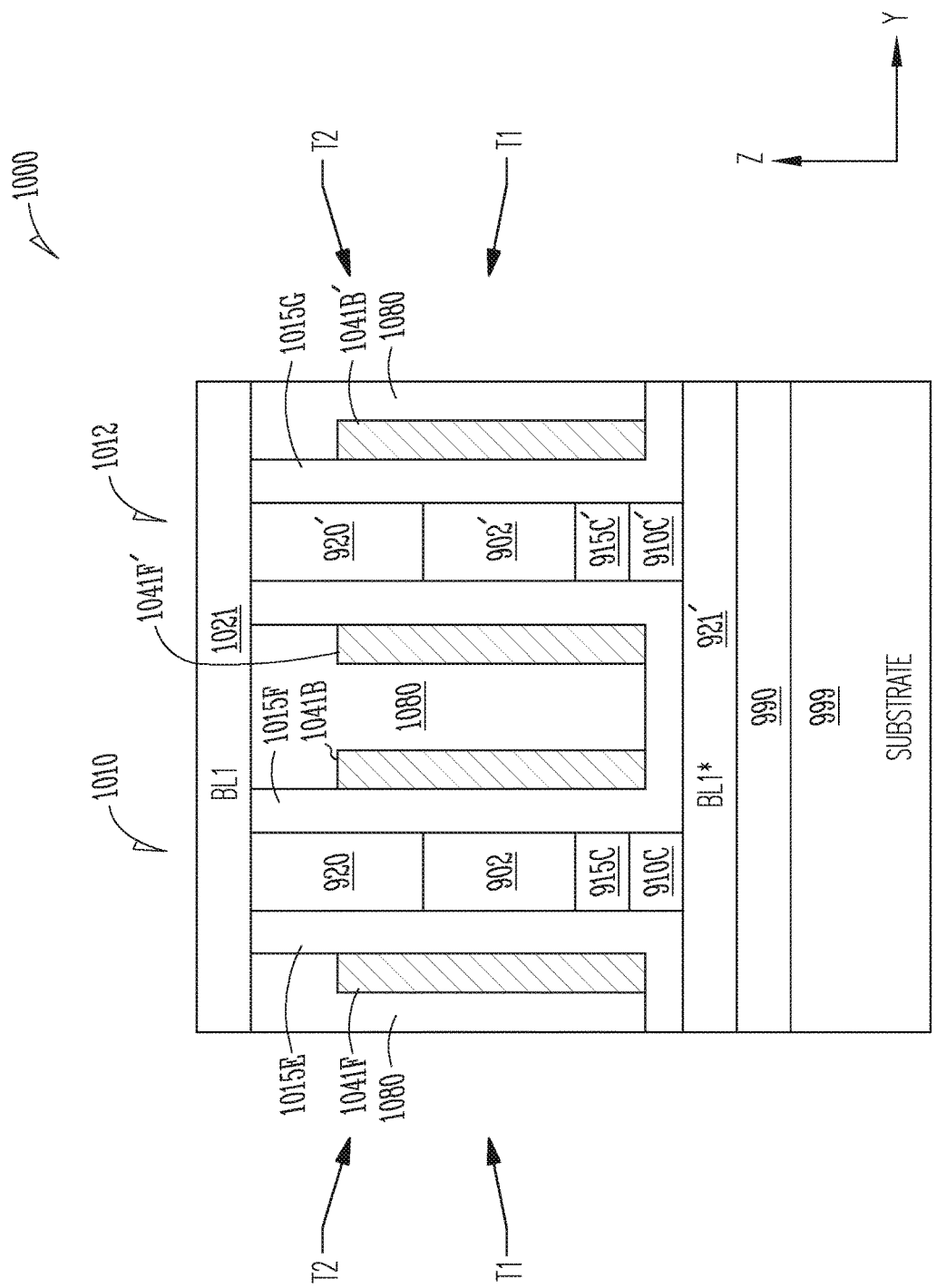

FIG. 10E shows memory device 1000 after a dielectric material 1080 and a data line 1021 are formed. FIG. 10E also shows a signal (e.g., bit line signal) BL1 that can represent a signal applied to data line 1021 during an operation (e.g., read or write) of memory device 1000. Signal BL1 can be similar to signal BL1 of memory device 500 in FIG. 5. In FIG. 10E, dielectric material 1080 can include silicon dioxide. Data line 1021 can be formed after dielectric material 1080 is formed and can be formed from conductive material (e.g., metal, conductively doped polysilicon, or other conductive materials).

As shown in FIG. 10E, data line 1021 can be formed such that it is electrically coupled to portions 920 and 920' and electrically separated from portions 1041F, 1041B, 1041F', and 1041B'. For example, the processes in FIG. 10E can include removing part (e.g., top part) of each of portions 1041F, 1041B, 1041F', and 1041B' before data line 1021 is formed, so that data line 1021 is electrically separated from portions 1041F, 1041B, 1041F', and 104B' when data line 1021 is formed.

As shown in FIG. 10E, part of memory device 1000 can form memory cells 1010 and 1012, which can be similar to memory cells 210 and 212 of memory device 200 (schematically shown in FIG. 2), respectively. In FIG. 10E, portions 1041F and 1041B can be part of an access line (e.g., word line and associated signal WL1) that can used to control transistors T1 and T2 of memory cell 1010 during a memory operation (e.g., read or write operation) of memory device 1000. Portions 1041F' and 1041B' can be part of an access line (e.g., word line and associated signal WL2) that can be used to control transistors T1 and T2 of memory cell 1012 during a memory operation (e.g., read or write operation) of memory device 1000.

In FIG. 10E, portion 920 can form a channel portion (e.g., write channel portion) of transistor T2 of memory cell 1010, portion 902 can form a charge storage structure (e.g., floating gate of transistor T1) of memory cell 1010, portion 915C can form part of a gate oxide of transistors T1 and T2 of memory cell 1010, and portion 910C can form part of a channel portion read channel portion) of transistor T1 of memory cell 1010. Portion 920' can form a channel portion (e.g., write channel portion) of transistor T2 of memory cell 1012, portion 902' can form a charge storage structure (e.g., floating gate of transistor T1) of memory cell 1012, portion 915C' can form part of a gate oxide of transistors T1 and T2 of memory cell 1012, and portion 910C can form part of a channel portion (e.g., read channel portion) of transistor T1 of memory cell 1010.

Figure 11A:
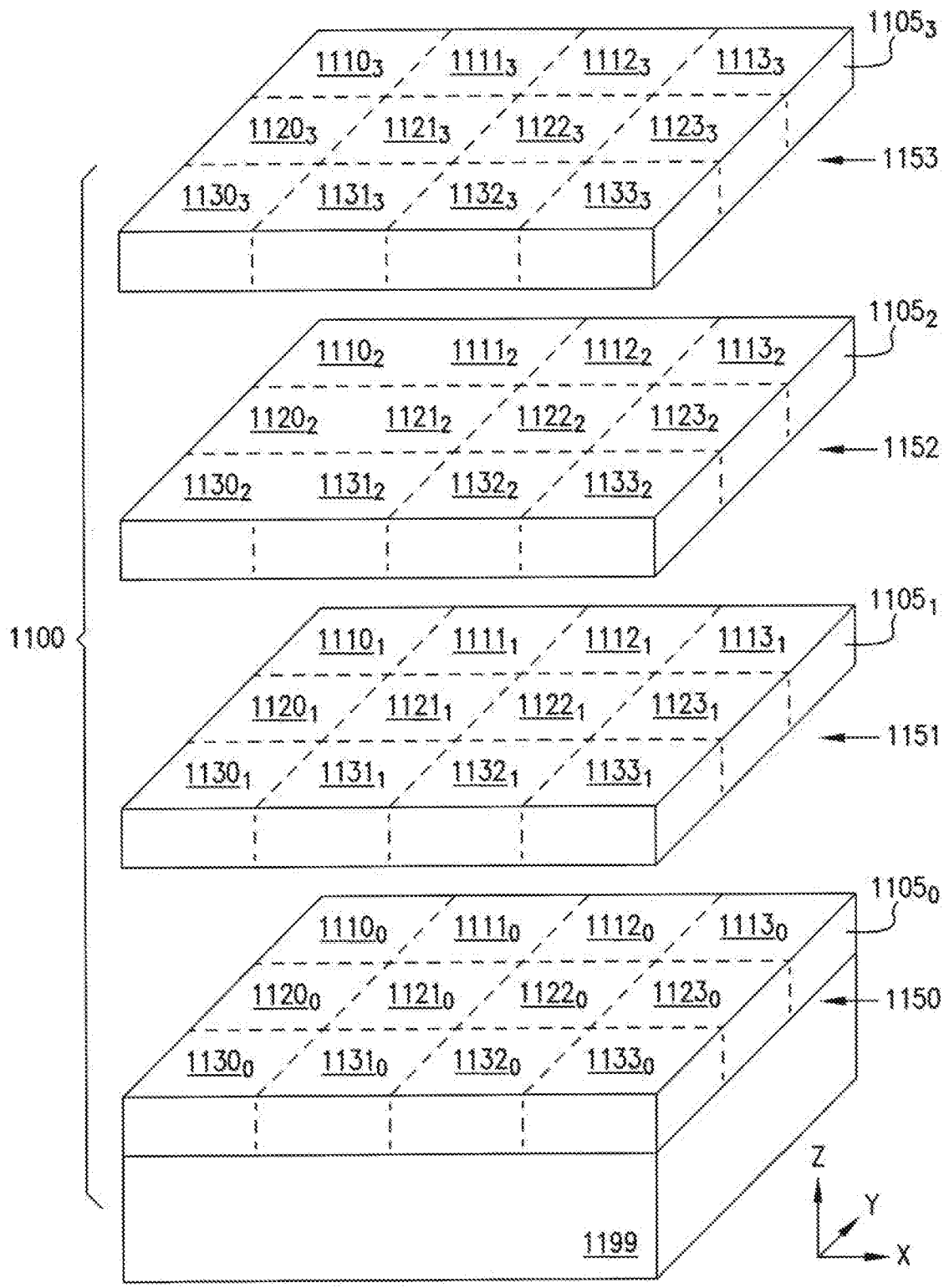
FIG. 11A, FIG. 11B, and FIG. 11C show different views of a structure of a memory device including multiple decks of memory cells, according to some embodiments described herein.
Figure 11B:
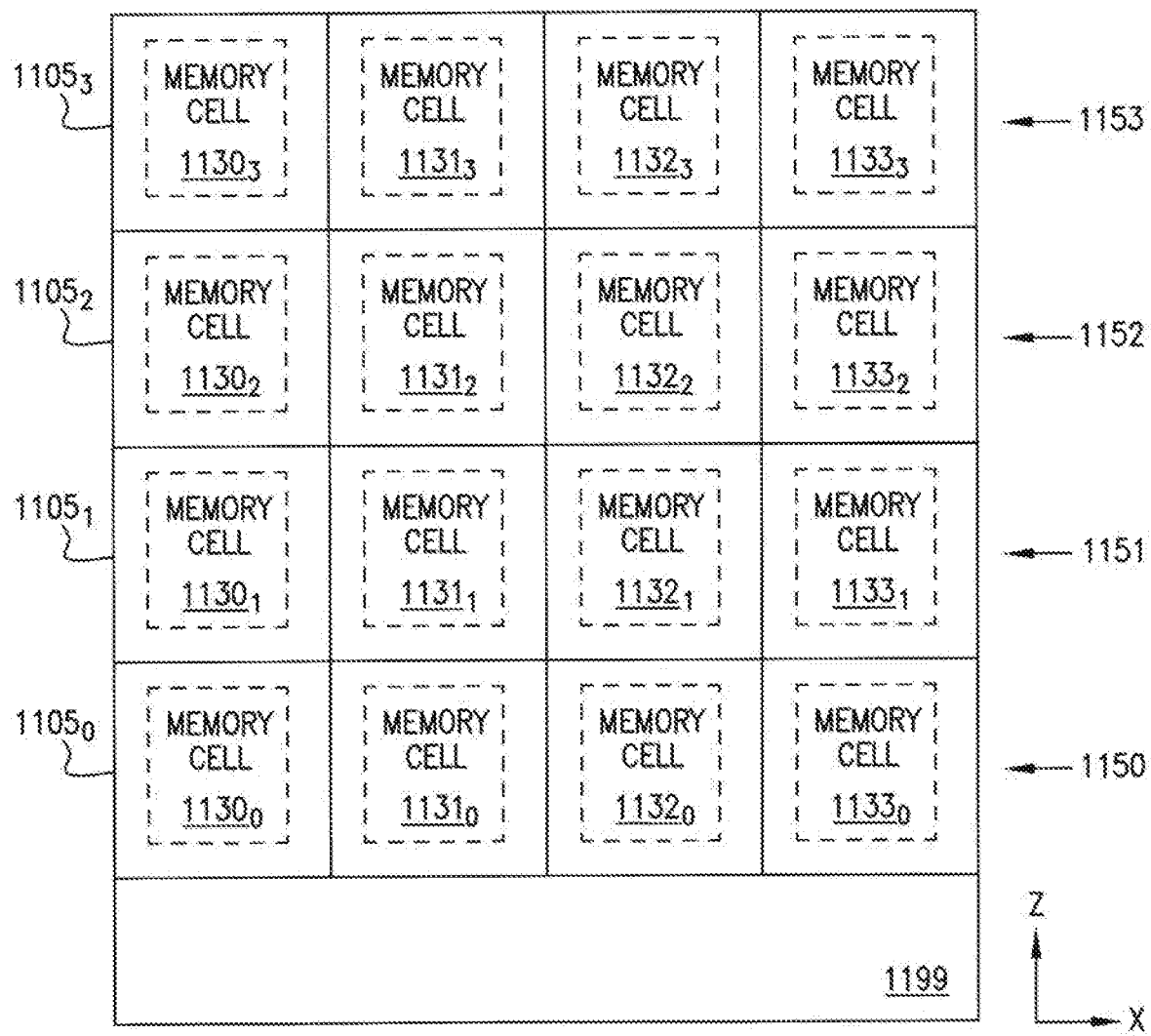
Figure 11C:
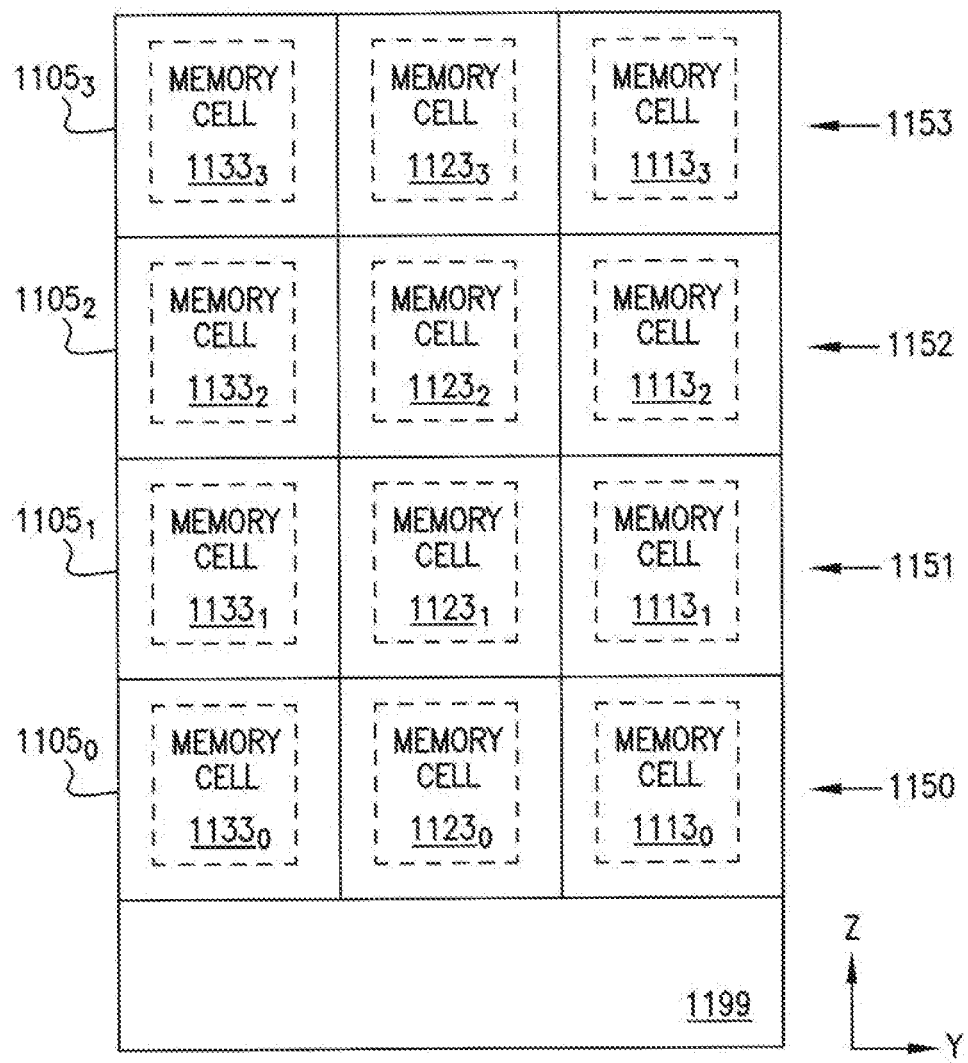

FIG. 11A, FIG. 11B, and FIG. 11C show different views of a structure of a memory device 1100 including multiple decks of memory cells, according to some embodiments described herein. FIG. 11A shows an exploded view (e.g., in the Z-direction) of memory device 1100. FIG. 11B shows a side view (e.g., cross-sectional view) in the X-direction and the Z-direction of memory device 110. FIG. 11C shows a side view (e.g., cross-sectional view) in the Y-direction and the Z-direction of memory device 1100.

As shown in FIG. 11A memory device 1100 can include decks (decks of memory cells) $1105_0$, $1105_1$, $1105_2$, and $1105_3$ that are shown separately from each other in an exploded view to help ease of viewing the deck structure of memory device 1100. In reality, decks $1105_0$, $1105_1$, $1105_2$, and $1105_3$ can be attached to each other in an arrangement where one deck can be formed (e.g., stacked) over another deck over a substrate (e.g., a semiconductor (e.g., silicon) substrate) 1199. For example, as shown in FIG. 11A, decks $1105_0$, $1105_1$, $1105_2$, and $1105_3$ can be formed in the Z-direction perpendicular to substrate 1199 (e.g., formed vertically in the Z-direction with respect to substrate 1199).

As shown in FIG. 11A, each of decks $1105_0$, $1105_1$, $1105_2$, and $1105_3$ can have memory cells arranged in the X-direction and the Y-direction (e.g., arranged in rows in the X-direction and in columns in the Y-direction). For example, deck $1105_0$ can include memory cells $1110_0$, $1111_0$, $1112_0$, and $1113_0$ (e.g., arranged in a row), memory cells $1120_0$, $1121_0$, $1122_0$, and $1123_0$ (e.g., arranged in a row), and memory cells $1130_0$, $1131_0$, $1132_0$, and $1133_0$ (e.g., arranged in a row).

Deck $1105_1$ can include memory cells $1110_1$, $1111_1$, $1112_1$, and $1113_1$ (e.g., arranged in a row), memory cells $1120_1$, $1121_1$, $1122_1$, and $1123_1$ (e.g., arranged in a row), and memory cells $1130_1$, $1131_1$, $1132_1$, and $1133_1$ (e.g., arranged in a row).

Deck $1105_2$ can include memory cells $1110_2$, $1111_2$, $1112_2$, and $1113_2$ (e.g., arranged in a row), memory cells $1120_2$, $1121_2$, $1122_2$, and $1123_2$ (e.g., arranged in a row), and memory cells $1130_2$, $1131_2$, $1132_2$, and $1133_2$ (e.g., arranged in a row).

Deck $1105_3$ can include memory cells $1110_3$, $1111_3$, $1112_3$, and $1113_3$ (e.g., arranged in a row), memory cells $1120_3$, $1121_3$, $1122_3$, and $1123_3$ (e.g., arranged in a row), and memory cells $1130_3$, $1131_3$, $1132_3$, and $1133_3$ (e.g., arranged in a row).

As shown in FIG. 11A, decks $1105_0$, $1105_1$, $1105_2$, and $1105_3$ can be located (e.g., formed vertically in the Z-direction) on levels (e.g., portions) 1150, 1151, 1152, and 1153, respectively, of memory device 1100. The arrangement of decks $1105_0$, $1105_1$, $1105_2$, and $1105_3$ forms a 3-dimensional (3-D) structure of memory cells of memory device 1100 in that different levels of the memory cells of memory device 1100 can be located (e.g., formed) in different levels (e.g., different vertical portions) 1150, 1151, 1152, and 1153 of memory device 1100.

Decks $1105_0$, $1105_1$, $1105_2$, and $1105_3$ can be formed one deck at a time. For example, decks $1105_0$, $1105_1$, $1105_2$, and $1105_3$ can be formed sequentially in the order of decks $1105_0$, $1105_1$, $1105_2$, and $1105_3$ (e.g., deck $1105_1$ is formed first and deck $1105_3$ is formed last). In this example, the memory cell of one deck (e.g., deck $1105_1$) can be formed either after formation of the memory cells of another deck (e.g., deck $1105_0$) or before formation of the memory cells of another deck (e.g., deck $1105_2$). Alternatively, decks $1105_0$, $1105_1$, $1105_2$, and $1105_3$ can be formed concurrently (e.g., simultaneously), such that the memory cells of decks $1105_0$, $1105_1$, $1105_2$, and $1105_3$ can be concurrently formed. For example, the memory cells in levels 1150, 1151, 1152, and 1153 of memory device 1100 can be concurrently formed.

The structures of the memory cells of each of decks $1105_0$, $1105_1$, $1105_2$, and $1105_3$ can include the structures of the memory cells described above with reference to FIG. 1 through FIG. 10E. For example, the structures of the of the memory cells of decks $1105_0$, $1105_1$, $1105_2$, and $1105_3$ can include the structure of the memory cells of memory devices 200, 900, and 1000.

Memory device 1100 can include data lines (e.g., bit lines) and access lines (e.g., word lines) to access the memory cells of decks $1105_0$, $1105_1$, $1105_2$, and $1105_3$. For simplicity, data lines and access lines of memory cells are omitted from FIG. 11A. However, the data lines and access lines of memory device 1100 can be similar to the data lines and access lines, respectively, of the memory devices described above with reference to FIG. 1 through FIG. 10E.

FIG. 11A shows memory device 1100 including four decks (e.g., $1105_0$, $1105_1$, $1105_2$, and $1105_3$) as an example. However, the number of decks can be different from four. FIG. 11A shows each of decks $1105_0$, $1105_1$, $1105_2$, and $1105_3$ including one level (e.g., layer) of memory cells as an example. However, at least one of the decks (e.g., one or more of decks $1105_0$, $1105_1$, $1105_2$, and $1105_3$) can have two (or more) levels of memory cells. FIG. 11A shows an example where each of decks $1105_0$, $1105_1$, $1105_2$, and $1105_3$ includes four memory cells (e.g., in a row) in the X-direction and three memory cells (e.g., in a column) in the Y-direction. However, the number of memory cells in a row, in a column, or both, can vary.

The illustrations of apparatuses (e.g., memory devices 100, 200, 900, 1000, and 1100) and methods (e.g., operations of memory devices 100 and 200, and methods of forming memory devices 900 and 1000) are intended to provide a general understanding of the structure of various embodiments and are not intended to provide a complete description of all the elements and features of apparatuses that might make use of the structures described herein. An apparatus herein refers to, for example, either a device (e.g., any of memory devices 100, 200, 900, 1000, and 1100) or a system (e.g., an electronic item that can include any of memory devices 100, 200, 900, 1000, and 1100).

Any of the components described above with reference to FIG. 1 through FIG. 10E can be implemented in a number of ways, including simulation via software. Thus, apparatuses (e.g., memory devices 100, 200, 900, 1000, and 1100) or part of each of these memory devices described above, may all be characterized as "modules" (or "module") herein. Such modules may include hardware circuitry, single- and/or multi-processor circuits, memory circuits, software program modules and objects and/or firmware, and combinations thereof, as desired and/or as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

The memory devices (e.g., memory devices 100, 200, 900, 1000, and 1100) described herein may be included in apparatuses electronic circuitry) such as high-speed computers, communication and signal processing circuitry, single- or multi-processor modules, single or multiple embedded processors, multicore processors, message information switches, and application-specific modules including multilayer, multichip modules. Such apparatuses may further be included as subcomponents within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 10E include apparatuses and methods of forming the apparatuses. One of the apparatuses includes a first data line, a second data line, a conductive line, and a memory cell coupled to the first and second data lines. The memory cell includes a first transistor and a second transistor. The first transistor includes a first region electrically coupled to the first and second data lines, and charge storage structure electrically separated from the first region. The second transistor includes a second region electrically separated from the first region, the second region electrically coupled to the charge storage structure and the second data line. The conductive line is electrically separated from the first and second channel regions. Part of the conductive line is spanning across part of the first region of the first transistor and part of the second region of the second transistor. Other embodiments, including additional apparatuses and methods, are described.

In the detailed description and the claims, the term "on" used with respect to two or more elements (e.g., materials), one "on" the other, means at least some contact between the elements between the materials). The term "over" means the elements (e.g., materials) are in close proximity, but possibly with one or more additional intervening elements (e.g., materials) such that contact is possible but not required. Neither "on" nor "over" implies any directionality as used herein unless stated as such.

In the detailed description and the claims, a list of items joined by the term "at least one of" can mean any combination of the listed items. For example, if items A and B are listed, then the phrase "at least one of A and B" means A only; B only; or A and B. In another example, if items A, B, and C are listed, then the phrase "at least one of A, B and C" means A only; B only; C only; A and B (excluding C); A and C (excluding B); B and C (excluding A); or all of A, B, and C. Item A can include a single element or multiple elements. Item B can include a single element or multiple elements. Item C can include a single element or multiple elements.

In the detailed description and the claims, a list of items joined by the term "one of" can mean only one of the list items. For example, if items A and B are listed, then the phrase "one of A and B" means A only (excluding B), or B only (excluding A). In another example, if items A, B, and C are listed, then the phrase "one of A, B and C" means A only; B only; or C only. Item A can include a single element or multiple elements. Item B can include a single element or multiple elements. Item C can include a single element or multiple elements.

The above description and the drawings illustrate some embodiments of the inventive subject matter to enable those skilled in the art to practice the embodiments of the inventive subject matter. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. An apparatus comprising:
 a first data line;
 a second data line;
 a memory cell coupled to the first and second data lines, the memory cell including:
 a first transistor including a first region coupled to the first and second data lines, and a charge storage structure separated from the first region; and
 a second transistor including a second region separated from the first region, the second region coupled to the charge storage structure and the second data line; and
 a conductive line separated from the first and second regions, part of the conductive line spanning across part of the first region of the first transistor and part of the second region of the second transistor.

2. The apparatus of claim 1, wherein the first region includes a channel region of the first transistor, and the second region includes a channel region of the second transistor.

3. The apparatus of claim 1, wherein the conductive line is part of an access line to access the memory cell.

4. The apparatus of claim 1, wherein the first region includes p-type semiconductor material, the second region includes n-type semiconductor material.

5. The apparatus of claim 1, wherein the first region includes a piece of semiconductor material.

6. The apparatus of claim 2, wherein the second region includes a piece of oxide material, and the charge storage structure includes one of a piece of metal and a piece of semiconductor material directly coupled to the piece of oxide material.

7. The apparatus of claim 2, wherein the second region includes at least one of zinc tin oxide (ZTO), indium zinc oxide (IZO), zinc oxide (ZnOx), indium gallium zinc oxide (IGZO), indium gallium silicon oxide (IGSO), indium oxide (InOx, In2O3), tin oxide (SnO2), titanium oxide (TiOx), zinc oxide nitride (ZnxOyNz), magnesium zinc oxide (MgxZnyOz), indium zinc oxide (InxZnyOz), indium gallium zinc oxide (InxGayZnzOa), zirconium indium zinc oxide (ZrxInyZnzOa), hafnium indium zinc oxide (HfxInyZnzOa), tin indium zinc oxide (SnxInyZnzOa), aluminum tin indium zinc oxide (AlxSnyInzZnaOd), silicon indium zinc oxide (SixInyZnzOa), zinc tin oxide (ZnxSnyOz), aluminum zinc tin oxide (AlxZnySnzOa), gallium zinc tin oxide (GaxZnySnzOa), zirconium zinc tin oxide (ZrxZnySnzOa), indium gallium silicon oxide (InGaSiO), and gallium phosphide (GaP).

8. The apparatus of claim 1, wherein the first region and the conductive line are located over a substrate, and the first region is closer to the substrate than the conductive line.

9. The apparatus of claim 1, wherein the first and second transistors have different threshold voltages.

10. The apparatus of claim 1, wherein the second transistor has a threshold voltage greater than a threshold voltage of the first transistor.

11. The apparatus of claim 1, wherein the first transistor has a first threshold voltage less than zero in when the charge storage structure is in a first state, and the first transistor has a second threshold voltage less than zero when the charge storage structure is in a second state, and the first and second states represent different values of information stored in the memory cell.

12. An apparatus comprising:
 a first conductive region located in a first level of the apparatus;
 a second conductive region located in a second level of the apparatus; and
 a memory cell located between the first and second levels and coupled to the first and second conductive regions, the memory cell including:

a first material located in a third level of the apparatus between the first and second levels, the first material forming a memory element of the memory cell;

a second material located in a fourth level of the apparatus between the second and third levels, the second material contacting the first material and the second conductive region; and a semiconductor material separated from the first and second materials, the semiconductor material contacting the first and second conductive regions.

13. The apparatus of claim 12, wherein the second material includes a piece of semiconductor material.

14. The apparatus of claim 13, wherein the first material includes a piece of metal directly coupled to the piece of semiconductor material.

15. The apparatus of claim 13, wherein the first material includes a piece of semiconductor material directly coupled to the piece of semiconductor material.

16. The apparatus of claim 12, wherein the second material and the semiconductor material have different conductivity types.

17. The apparatus of claim 12, wherein the second material includes at least one of zinc tin oxide (ZTO), indium zinc oxide (IZO), zinc oxide (ZnOx), indium gallium zinc oxide (IGZO), indium gallium silicon oxide (IGSO), indium oxide (InOx, In2O3), tin oxide (SnO2), titanium oxide (TiOx), zinc oxide nitride (ZnxOyNz), magnesium zinc oxide (MgxZnyOz), indium zinc oxide (InxZnyOz), indium gallium zinc oxide (InxGayZnzOa), zirconium indium zinc oxide (ZrxInyZnzOa), hafnium indium zinc oxide (HfxInyZnzOa), tin indium zinc oxide (SnxInyZnzOa), aluminum tin indium zinc oxide (AlxSnyInzZnaOd), silicon indium zinc oxide (SixInyZnzOa), zinc tin oxide (ZnxSnyOz), aluminum zinc tin oxide (AlxZnySnzOa), gallium zinc tin oxide (GaxZnySnzOa), zirconium zinc tin oxide (ZrxZnySnzOa), indium gallium silicon oxide (InGaSiO), and gallium phosphide (GaP).

18. The apparatus of claim 12, wherein the semiconductor material includes:

a first portion separated from a first side of the first material and a first side of the second material by a first dielectric;

a second portion separated from a second side of the first material and a second side of the second material by a second dielectric; and a third portion separated from the first material by a third dielectric.

19. The apparatus of claim 12, further comprising a conductive material, the conductive material includes a portion adjacent a side of the first material and adjacent a side of the second material, wherein a direction from the first conductive region to the first and second materials through the first and second materials is a first direction, the conductive material has a length extending in a second direction.

20. The apparatus of claim 19, further comprising an additional conductive material, the additional conductive material includes a portion adjacent an additional side of the first material and adjacent an additional side of the second material, and the additional conductive material has a length extending in the second direction.

21. The apparatus of claim 20, wherein the conductive material and the additional conductive material are part of an access line of the apparatus.

22. The apparatus of claim 12, wherein the first conductive region is part of a first data line of the apparatus, and the second conductive region is part of a second data line of the apparatus.

23. A method comprising:
forming a first material over substrate;
forming a second material directly on the first material;
removing part of the first material to form first portions from a remaining part of the first material, the first portions being separated from each other;
removing part of the second material to form second portions from a remaining part of the second material, the second portions being separated from each other; and
forming memory cells such that each of the memory cells includes a first transistor and a second transistor, the first transistor including a charge storage structure formed from one of the first portions, the second transistor including a region formed from one of the second portions.

24. The method of claim 23, wherein forming the first material includes depositing a metal material over the substrate.

25. The method of claim 23, wherein forming the second material includes depositing a semiconductor material on the first material.

26. The method of claim 23, wherein forming the second material includes depositing an oxide material on the first material.

27. The method of claim 23, wherein forming the second material includes depositing directly over the first material at least one of zinc tin oxide (ZTO), indium zinc oxide (IZO), zinc oxide (ZnOx), indium gallium zinc oxide (IGZO), indium gallium silicon oxide (IGSO), indium oxide (InOx, In2O3), tin oxide (SnO2), titanium oxide (TiOx), zinc oxide nitride (ZnxOyNz), magnesium zinc oxide (MgxZnyOz), indium zinc oxide (InxZnyOz), indium gallium zinc oxide (InxGayZnzOa), zirconium indium zinc oxide (ZrxInyZnzOa), hafnium indium zinc oxide (HfxInyZnzOa), tin indium zinc oxide (SnxInyZnzOa), aluminum tin indium zinc oxide (AlxSnyInzZnaOd), silicon indium zinc oxide (SixInyZnzOa), zinc tin oxide (ZnxSnyOz), aluminum zinc tin oxide (AlxZnySnzOa), gallium zinc tin oxide (GaxZnySnzOa), zirconium zinc tin oxide (ZrxZnySnzOa), indium gallium silicon oxide (InGaSiO), and gallium phosphide (GaP).

28. The method of claim 23, further comprising:
forming a first conductive material over the substrate before the first and second materials are formed, the first conductive material is formed such that the first conductive material is separated from the first material;
removing part of the first conductive material to form a first data line;
forming channel region that contacts the first data line;
forming a second conductive material that contacts the channel region and the second material; and
removing part of the second conductive material to form a second data line.

29. The method of claim 23, further comprising:
forming a first conductive line adjacent a first side of a semiconductor region of the first transistor and adjacent a first side of the region of the second transistor; and
forming a second conductive line adjacent a second side of the semiconductor region of the first transistor and adjacent a second side of the region of the second transistor.

* * * * *